United States Patent
Do et al.

(10) Patent No.: US 11,990,568 B2
(45) Date of Patent: May 21, 2024

(54) LIGHT EMITTING DEVICE, DISPLAY DEVICE COMPRISING SAME, AND METHOD FOR MANUFACTURING DISPLAY DEVICE

(71) Applicant: SAMSUNG DISPLAY CO., LTD., Yongin-Si (KR)

(72) Inventors: Young Rag Do, Seoul (KR); Byung Ju Lee, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 485 days.

(21) Appl. No.: 17/423,084

(22) PCT Filed: Jul. 15, 2019

(86) PCT No.: PCT/KR2019/008731
§ 371 (c)(1),
(2) Date: Jul. 14, 2021

(87) PCT Pub. No.: WO2020/149474
PCT Pub. Date: Jul. 23, 2020

(65) Prior Publication Data
US 2022/0085247 A1    Mar. 17, 2022

(30) Foreign Application Priority Data
Jan. 15, 2019    (KR) ......................... 10-2019-0005451

(51) Int. Cl.
*H01L 33/38*    (2010.01)
*H01L 27/15*    (2006.01)
(Continued)

(52) U.S. Cl.
CPC .......... *H01L 33/382* (2013.01); *H01L 27/156* (2013.01); *H01L 33/005* (2013.01);
(Continued)

(58) Field of Classification Search
CPC ............. H01L 25/0753; H01L 25/0756; H01L 33/382; H01L 33/62; H01L 2933/0016; H01L 25/167

See application file for complete search history.

(56) References Cited

U.S. PATENT DOCUMENTS

| 7,498,603 B2 | 3/2009 | Rogojevic et al. |
| 9,166,111 B2 | 10/2015 | Matsui et al. |

(Continued)

FOREIGN PATENT DOCUMENTS

| JP | 2012-004535 A | 1/2012 |
| KR | 10-2009-0087500 A | 8/2009 |

(Continued)

OTHER PUBLICATIONS

International Search Report for corresponding Application No. PCT/KR2019/008731 dated Oct. 24, 2019, 4pp.

*Primary Examiner* — Wasiul Haider
(74) *Attorney, Agent, or Firm* — Lewis Roca Rothgerber Christie LLP

(57) ABSTRACT

A light emitting device, a display device including a light emitting device, and a method of manufacturing a display device are provided. A light emitting device may include a substrate, and a plurality of light emitting element layers stacked on the substrate. Each of the light emitting element layers may include an insulating layer entirely disposed on the substrate, a first electrode and a second electrode disposed on the insulating layer and spaced apart from each other, and a plurality of light emitting elements disposed between the first electrode and the second electrode.

20 Claims, 25 Drawing Sheets

(51) Int. Cl.
  *H01L 33/00* (2010.01)
  *H01L 33/20* (2010.01)
  *H01L 33/62* (2010.01)
(52) U.S. Cl.
  CPC .............. *H01L 33/20* (2013.01); *H01L 33/62* (2013.01); *H01L 2933/0016* (2013.01)

(56) References Cited

U.S. PATENT DOCUMENTS

| | | |
|---|---|---|
| 9,181,630 B2 | 11/2015 | Shibata et al. |
| 9,329,433 B2 | 5/2016 | Negishi et al. |
| 10,211,418 B2 | 2/2019 | Im et al. |
| 10,367,123 B2 | 7/2019 | Im et al. |
| 10,438,992 B2 | 10/2019 | Kim et al. |
| 2017/0288093 A1* | 10/2017 | Cha .................... H01L 33/382 |
| 2018/0019426 A1 | 1/2018 | Im et al. |
| 2019/0165207 A1* | 5/2019 | Kim .................... H01L 33/505 |

FOREIGN PATENT DOCUMENTS

| | | |
|---|---|---|
| KR | 10-0955319 B1 | 4/2010 |
| KR | 10-2013-0033450 A | 4/2013 |
| KR | 10-2018-0009015 A | 1/2018 |
| KR | 10-2018-0055021 A | 5/2018 |
| KR | 10-2020-0088960 A | 7/2020 |
| KR | 10-2020-0088961 A | 7/2020 |
| KR | 10-2020-0088962 A | 7/2020 |
| WO | WO 2012/091042 A1 | 7/2012 |
| WO | WO 2016/129873 A4 | 8/2016 |
| WO | WO 2018/064806 A1 | 4/2018 |
| WO | WO 2018/175338 A1 | 9/2018 |

* cited by examiner

LIGHT EMITTING DEVICE, DISPLAY DEVICE COMPRISING SAME, AND METHOD FOR MANUFACTURING DISPLAY DEVICE

CROSS-REFERENCE TO RELATED APPLICATIONS

This application is a U.S. National Phase patent application of International Patent Application Number PCT/KR2019/008731, filed on Jul. 15, 2019, which claims priority to Korean Patent Application Number 10-2019-0005451, filed on Jan. 15, 2019, the entire contents of both of which are incorporated herein by reference.

TECHNICAL FIELD

Various embodiments of the present disclosure relate to a light emitting device, a display device including a light emitting device, and a method of manufacturing a display device.

BACKGROUND ART

Recently, a technique of manufacturing a subminiature light emitting element using a material having a highly reliable inorganic crystal structure and manufacturing alight emitting device using the light emitting element has been developed. For example, technology for configuring a light source of a light emitting device using subminiature light emitting elements having a small size ranging from a nanoscale to a microscale has been developed. Such a light emitting device may be used in various electronic devices, such as a display device or a lighting device.

A typical light emitting device includes sub-pixels which are arranged in a horizontal structure and emit light in different colors, such as red, green, and blue, and the resolution of the light emitting device is limited by the sizes of sub-pixels and an interval between the sub-pixels.

Further, the number of subminiature light emitting elements that can be arranged in a unit area (e.g., an area corresponding to one sub-pixel) is limited, thus making it difficult to acquire an improved light quantity.

SUMMARY

According to an aspect of embodiments of the present disclosure, a light emitting device having improved luminance and/or high resolution, and a display device having the light emitting device are provided.

According to another aspect of embodiments of the present disclosure, a display device manufacturing method of manufacturing the above-described display device is provided.

According to one or more embodiments of the present disclosure, alight emitting device may include a substrate; and a plurality of light emitting element layers stacked on the substrate. Each of the light emitting element layers may include an insulating layer disposed on an overall surface of the substrate; a first electrode and a second electrode disposed on the insulating layer and spaced apart from each other; and a plurality of light emitting elements disposed between the first electrode and the second electrode.

According to an embodiment, the light emitting device may further include a common electrode layer disposed between a first light emitting element layer closest to the substrate, among the light emitting element layers, and the substrate, and including a first common electrode and a second common electrode spaced apart from each other.

According to an embodiment, the first electrode may overlap the first common electrode, and the second electrode may overlap the second common electrode.

According to an embodiment, each of the light emitting elements may be a rod-type light emitting diode having a size in a range from a nanoscale to a microscale.

According to an embodiment, each of the light emitting element layers may emit monochromatic light.

According to an embodiment, at least a part of the light emitting element layers may emit different colors of light.

According to an embodiment, the light emitting elements may be disposed between the first and second electrodes and the insulating layer, respective first ends of the light emitting elements may be coupled to the first electrode, and respective second ends of the light emitting elements may be coupled to the second electrode.

According to an embodiment, the light emitting element layers may include a first light emitting element layer, a second light emitting element layer, and a third light emitting element layer that are sequentially disposed on the substrate, the first light emitting element layer includes first light emitting elements configured to emit light in a first color, the second light emitting element layer includes second light emitting elements configured to emit light in a second color, and the third light emitting element layer includes third light emitting elements configured to emit light in a third color.

According to an embodiment, the light emitting device may further include a bank pattern disposed between a first light emitting element layer closest to the substrate, among the plurality of light emitting element layers, and the substrate, wherein the substrate includes an emission area and a non-emission area around (e.g., enclosing) the emission area, the light emitting elements are disposed on the emission area of the substrate, and a thickness of the bank pattern is greater than a thickness of the light emitting element layers.

According to one or more embodiments of the present disclosure, alight emitting device according to embodiments of the present disclosure may include a substrate; a circuit element layer including a plurality of transistors and a power line; a common electrode layer including a first common electrode and a second common electrode disposed on the substrate and spaced apart from each other; and a plurality of light emitting element layers sequentially disposed on the common electrode layer, wherein each of the light emitting element layers includes an insulating layer disposed on an overall surface of the substrate; a first electrode and a second electrode disposed on the insulating layer and spaced apart from each other; and a plurality of light emitting elements disposed between the first electrode and the second electrode, wherein the first electrode is coupled to one of the transistors, and the second electrode is coupled to the power line.

According to an embodiment, the light emitting element layers may include a first light emitting element layer, a second light emitting element layer, and a third light emitting element layer that are sequentially disposed on the substrate, the first light emitting element layer includes first light emitting elements configured to emit light in a first color, the second light emitting element layer includes second light emitting elements configured to emit light in a second color, and the third light emitting element layer includes third light emitting elements configured to emit light in a third color.

According to an embodiment, a first electrode of the first light emitting element layer is coupled to a first transistor among the transistors, through a first contact hole passing through an insulating layer of the first light emitting element layer, and a second electrode of the first light emitting element layer is coupled to the power line through a second contact hole passing through the insulating layer of the first light emitting element layer.

According to an embodiment, the first light emitting element layer further includes a first bridge pattern disposed to be spaced apart from the first electrode and the second electrode, a first electrode of the second light emitting element layer is coupled to a second transistor among the transistors through a third contact hole, configured to expose the first bridge pattern by passing through an insulating layer of the second light emitting element layer, and the first bridge pattern of the first light emitting element layer, and a second electrode of the second light emitting element layer is coupled to the second electrode of the first light emitting element layer through a fourth contact hole configured to expose the second electrode of the first light emitting element layer by passing through the insulating layer of the second light emitting element layer.

According to an embodiment, a first electrode of the third light emitting element layer is coupled to a third transistor, among the transistors, through a fifth contact hole passing through an insulating layer of the third light emitting element layer, and a second electrode of the third light emitting element layer is coupled to the second electrode of the second light emitting element layer through a sixth contact hole configured to expose the second electrode of the second light emitting element layer by passing through the insulating layer of the third light emitting element layer.

According to one or more embodiments of the present disclosure, a method of manufacturing a display device includes: preparing a substrate; forming, on the substrate, a common electrode layer including a first common electrode and a second common electrode spaced apart from each other; forming a first light emitting element layer on the common electrode layer; and forming a second light emitting element layer on the first light emitting element layer, wherein forming the first light emitting element layer includes forming a first insulating layer on the common electrode layer; aligning a plurality of first light emitting elements on the first insulating layer, wherein the first light emitting elements are disposed between the first common electrode and the second common electrode on a plan view; and respectively forming a first electrode on first ends of the first light emitting elements and a second electrode on second ends of the first light emitting elements.

According to an embodiment, each of the first light emitting elements may be a rod-type light emitting diode having a size in a range from a nanoscale to a microscale.

According to an embodiment, aligning the first light emitting elements may include providing the first light emitting elements on the first insulating layer; and applying a first alternating current voltage between the first common electrode and the second common electrode.

According to an embodiment, the first electrode may overlap at least a portion of the first common electrode, and the second electrode may overlap at least a portion of the second common electrode.

According to an embodiment, forming the second light emitting element layer may include forming a second insulating layer on the first light emitting element layer; aligning a plurality of second light emitting elements between the first common electrode and the second common electrode on a plan view, and respectively forming a third electrode on first ends of the second light emitting elements and a fourth electrode on second ends of the second light emitting elements.

According to an embodiment, the first light emitting elements may emit light in a first color, and the second light emitting elements may emit light in a second color.

A light emitting device and a display device according to embodiments of the present disclosure may include light emitting element layers having a multilayer structure in which light emitting elements are arranged in three dimensions, thus realizing improved luminance and high resolution.

A method of manufacturing a display device according to embodiments of the present disclosure may manufacture a display device including light emitting element layers having a multilayer structure by repeatedly performing formation of an electric field and alignment of light emitting elements using separate common electrodes that do not come into contact with light emitting elements.

DETAILED DESCRIPTION

Figure 1A:
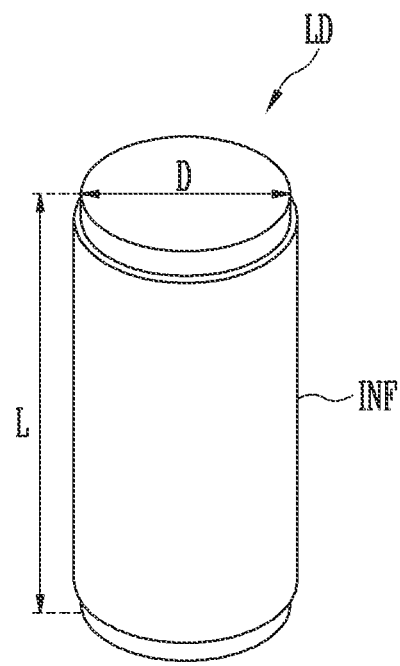
FIGS. 1A and 1B are a perspective view and a cross-sectional view, respectively, illustrating a light emitting element according to an embodiment of the present disclosure.

Reference will now be made in further detail to various embodiments of the present disclosure, some examples of which are illustrated in the accompanying drawings and described below, although the embodiments of the present disclosure can be variously modified in many different forms. That is, the present disclosure may be modified and practiced in various forms rather than being limited by the following embodiments.

Some elements which are not directly related to the features of the present disclosure in the drawings may be omitted to clearly explain the present disclosure. Further, the sizes, ratios, etc. of some elements in the drawings may be exaggerated for purposes of illustration. The same reference numerals are used to designate the same or similar elements throughout the drawings, and, thus, repeated descriptions thereof may be omitted.

Terms such as "first" and "second" may be used to identify and describe various components, but do not limit the various components. Further, in the present specification, it is to be understood that terms such as "include" or "have" are merely intended to indicate that features, numbers, steps, operations, components, parts, or combinations thereof are present, and are not intended to exclude the possibility that one or more other features, numbers, steps, operations, components, parts, or combinations thereof will be present or added. Further, when a first part, such as a layer, a film, a region, or a plate, is disposed on a second part, the first part may be not only directly on the second part but one or more third parts may intervene between them. Further, a specific location or direction defined in the following description is merely described from a relative standpoint, and the location or direction may be reversely changed depending on, for example, a view or orientation.

Embodiments and details of the present disclosure are described with reference to the accompanying drawings in order to describe the present disclosure in detail so that those having ordinary knowledge in the technical field to which the present disclosure pertains can easily practice the present disclosure. Further, a singular form may include a plural from as long as it is not specifically stated otherwise.

Figure 1B:
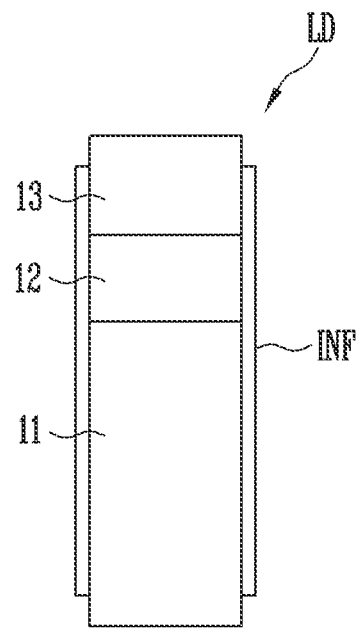

FIGS. 1A and 1B are a perspective view and a cross-sectional view, respectively, illustrating a light emitting element according to an embodiment of the present disclosure. Although a cylindrical rod-type light emitting element LD is illustrated in FIGS. 1A and 1B, a type and/or shape of the light emitting element LD according to the present disclosure are not limited thereto.

Referring to FIGS. 1A and 1B, the light emitting element LD may include a first conductive semiconductor layer 11, a second conductive semiconductor layer 13, and an active layer 12 interposed between the first and second conductive semiconductor layers 11 and 13. In an example, the light emitting element LD may be configured as a stacked body in which the first conductive semiconductor layer 11, the active layer 12, and the second conductive semiconductor layer 13 are sequentially stacked along a direction.

In an embodiment, the light emitting element LD may be provided in the form of a rod extending in a direction. The light emitting element LD may have a first end and a second end in the direction.

In an embodiment, one of the first and second conductive semiconductor layers 11 and 13 may be disposed on the first end of the light emitting element LD, and the other of the first and second conductive semiconductor layers 11 and 13 may be disposed on the second end of the light emitting element LD.

In an embodiment, the light emitting element LD may be a rod-type light emitting diode fabricated in the form of a rod. Here, a rod-type includes a rod-like shape or a bar-like shape, such as a cylindrical shape or a prismatic shape, which has a longitudinal length greater than a lateral length (i.e., which has an aspect ratio greater than 1), and a cross-sectional shape thereof is not particularly limited. For example, a length L of the light emitting element LD may be greater than a diameter D thereof (or a width of the cross-section thereof).

In an embodiment, the light emitting element LD may have a size as small as a nanoscale or a microscale, e.g., a diameter D and/or a length L falling within a microscale or nanoscale range. However, the size of the light emitting element LD is not limited thereto. For example, the size of the light emitting element LD may be changed in various ways depending on design conditions of various types of devices, e.g., a display device, which employs, as a light source, a light emitting device using the light emitting element LD.

In an embodiment, the first conductive semiconductor layer 11 may include at least one n-type semiconductor layer. For instance, the first conductive semiconductor layer 11 may include any semiconductor material of InAlGaN, GaN, AlGaN, InGaN, AlN, and InN, and may be doped with a first conductive dopant, such as Si, Ge, or Sn. However, the material forming the first conductive semiconductor layer 11 is not limited to this, and the first conductive semiconductor layer 11 may be formed of various materials in addition to the above materials. A thickness of the first conductive semiconductor layer 11 may be, but is not limited to, 500 nm to 5 μm.

The active layer 12 may be disposed on the first conductive semiconductor layer 11, and may be formed to have a single- or multi-quantum well structure. In an embodiment, a cladding layer (not shown) doped with a conductive dopant may be formed on and/or under the active layer 12. For example, the cladding layer may be formed of an AlGaN layer or an InAlGaN layer. In an embodiment, a material such as AlGaN or AlInGaN may be used to form the active layer 12, and, in addition, various other materials may be used to form the active layer 12.

When an electric field of a certain voltage (e.g., a predetermined voltage) or more is applied to the opposite ends of the light emitting element LD, the light emitting element LD may emit light while electron-hole pairs are coupled in the active layer 12. Since light emission by the light emitting element LD is controlled based on the foregoing principle, the light emitting element LD may be used as a light source of various light emitting devices as well as pixels of a display device. A thickness of the active layer 12 may be, but is not limited to, 10 nm to 200 nm.

The second conductive semiconductor layer 13 may be disposed on the active layer 12, and may include a semiconductor layer of a type different from that of the first conductive semiconductor layer 11. For example, the second conductive semiconductor layer 13 may include at least one p-type semiconductor layer. For instance, the second conductive semiconductor layer 13 may include a semiconductor material corresponding to at least one of InAlGaN, GaN, AlGaN, InGaN, AlN, and InN, and may be doped with a second conductive dopant, such as Mg. However, the material forming the second conductive semiconductor layer 13 is not limited to this, and the second conductive semiconductor layer 13 may be formed of various materials in addition to the above materials. The thickness of the second conductive semiconductor layer 13 may be, but is not limited to, 50 nm to 500 nm.

In accordance with an embodiment, the light emitting element LD may further include an insulating film INF provided on a surface thereof. The insulating film INF may be formed on the surface of the light emitting element LD to enclose an outer circumferential surface of at least the active layer 12, and, in addition, the insulating film INF may further enclose a portion of each of the first and second conductive semiconductor layers 11 and 13. Here, the insulating film INF may expose the opposite ends of the light emitting element LD having different polarities. For example, the insulating film INF may expose a first end of each of the first and second conductive semiconductor layers 11 and 13 that are disposed on the respective opposite ends of the light emitting element LD in a longitudinal direction, e.g., may expose two surfaces (i.e., top and bottom surfaces) of the cylinder, rather than covering it.

In an embodiment, the insulating film INF may include, but is not limited to, at least one insulating material of $SiO_2$, $Si_3N_4$, $Al_2O_3$, and $TiO_2$. That is, the material forming the insulating film INF is not limited to a particular material, and the insulating film INF may be formed of any of various well-known insulating materials.

In an embodiment, the light emitting element LD may further include additional components as well as the first conductive semiconductor layer 11, the active layer 12, the second conductive semiconductor layer 13, and the insulating film INF. For example, the light emitting element LD may further include one or more fluorescent layers, active layers, semiconductor layers, and/or electrode layers disposed on first ends of the first conductive semiconductor layer 11, the active layer 12, and/or the second conductive semiconductor layer 13.

Figure 2A:
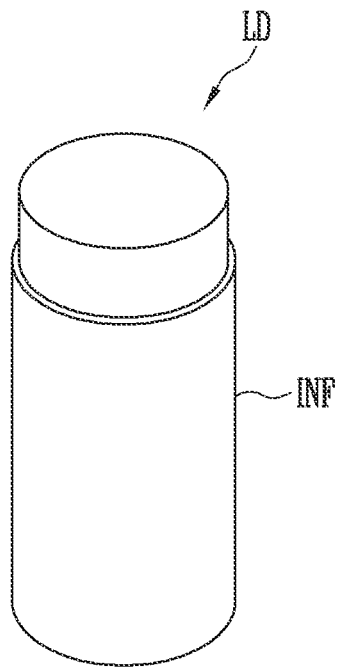
FIGS. 2A and 2B are a perspective view and a cross-sectional view, respectively, illustrating a light emitting element according to another embodiment of the present disclosure.
Figure 2B:
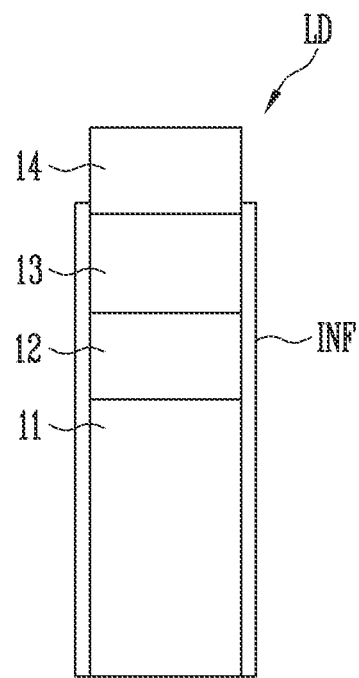
Figure 3A:
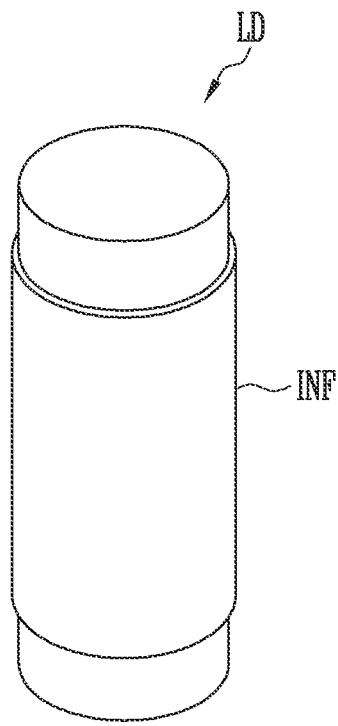
FIGS. 3A and 3B are a perspective view and a cross-sectional view, respectively, illustrating a light emitting element according to another embodiment of the present disclosure.
Figure 3B:
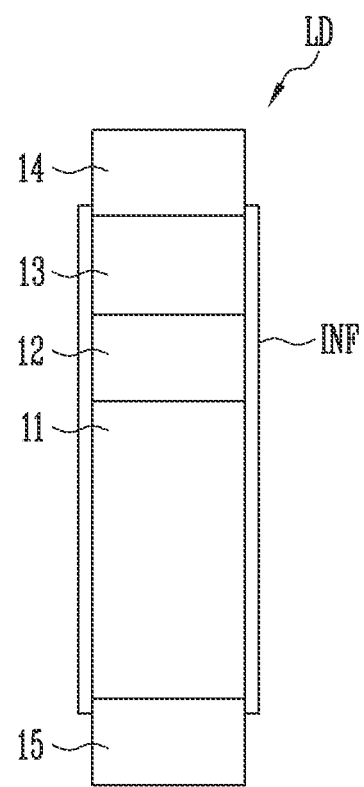

FIGS. 2A and 2B are a perspective view and a cross-sectional view, respectively, illustrating a light emitting element according to another embodiment of the present disclosure. FIGS. 3A and 3B are a perspective view and a cross-sectional view, respectively, illustrating a light emitting element according to another embodiment of the present disclosure.

Referring to FIGS. 2A and 2B, the light emitting element LD may further include at least one electrode layer 14 disposed on one end of the second conductive semiconductor layer 13.

Referring to FIGS. 3A and 3B, the light emitting element LD may further include at least one additional electrode layer 15 disposed on one end of the first conductive semiconductor layer 11.

Each of the electrode layers 14 and 15 may be, but is not limited to, an ohmic contact electrode. Also, each of the electrode layers 14 and 15 may include a metal or conductive metal oxide, and may be formed by using, for example, any of chromium (Cr), titanium (Ti), aluminum (Al), gold (Au), nickel (Ni), indium tin oxide (ITO), indium zinc oxide (IZO), indium tin zinc oxide (ITZO), and an oxide or alloy thereof alone or in combination with each other. The electrode layers 14 and 15 may be substantially transparent or translucent. Thereby, light generated from the light emitting element LD may be emitted to the outside of the light emitting element LD after passing through the electrode layers 14 and 15. The thickness of each of the electrode layers 14 and 15 may be, but is not limited to, 1 nm to 200 nm.

In an embodiment, the insulating film INF may at least partially enclose the outer surfaces of the electrode layers 14 and 15, or may not enclose them. In other words, the insulating film INF may be selectively formed on the surfaces of the electrode layers 14 and 15. Further, the insulating film INF may be formed to expose the opposite ends of the light emitting element LD having different polarities, for example, expose at least an area of each of the electrode layers 14 and 15. However, the present disclosure is not limited thereto, and, in an embodiment, the insulating film INF may not be provided.

The insulating film INF may be provided on the surface of the light emitting element LD, for example, on the surface of the active layer 12, thus preventing or substantially preventing the active layer 12 from short-circuiting with at least one electrode (e.g., at least one of contact electrodes coupled to the opposite ends of the light emitting element LD) or the like. As a result, the electrical stability of the light emitting element LD may be secured.

Further, the insulating film INF is formed on the surface of the light emitting element LD, thus minimizing or reducing defects on the surface of the light emitting element LD and improving the lifespan and efficiency of the light emitting element LD. Further, the insulating film INF is formed on the light emitting element LD, and, thus, an undesired short circuit may be prevented or substantially prevented from occurring between a plurality of light emitting elements LD even if the light emitting elements LD are arranged closer to each other.

In an embodiment, the light emitting element LD may be manufactured through a surface processing procedure (e.g., coating). For example, when the plurality of light emitting elements LD are mixed with a fluidic solution and are provided to respective emission areas (e.g., emission areas of respective pixels), the light emitting elements LD may be uniformly or substantially uniformly distributed without being condensed in the solution. Here, an emission area may be an area in which light is emitted from the light emitting elements LD, and may be distinguished from a non-emission area in which light is not emitted.

A light emitting device including light emitting elements LD may be used in various types of devices requiring a light source, as well as in a display device. For example, a plurality of subminiature light emitting elements LD may be arranged in each pixel area of a display panel, and an emission unit of each pixel may be configured through the light emitting elements LD. However, the field of application of the light emitting elements LD in the present disclosure is not limited to a display device. For example, the light emitting elements LD may also be used in other types of devices, such as a lighting device, which requires a light source.

Figure 4:
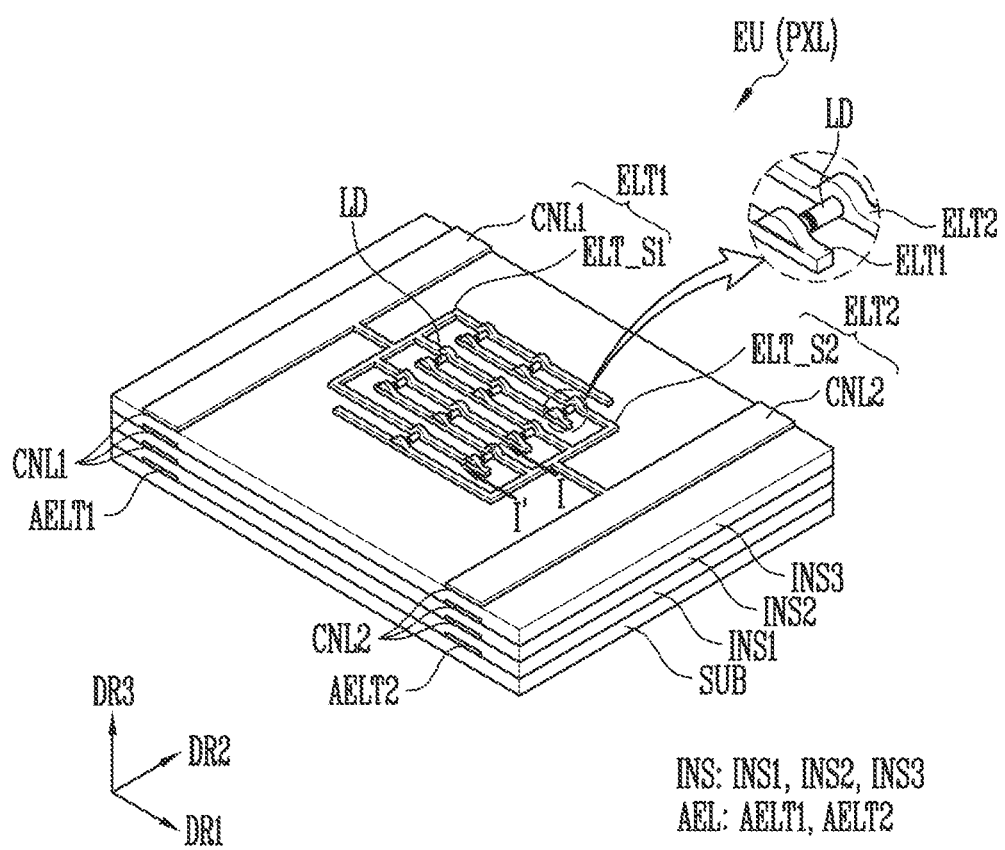
FIG. 4 is a perspective view illustrating a light emitting device according to an embodiment of the present disclosure.

FIG. 4 is a perspective view illustrating a light emitting device according to an embodiment of the present disclosure. In FIG. 4, a light emitting device EU is illustrated as an example of a device that is capable of using the light emitting elements LD described with reference to FIGS. 1A to 3B, as light sources. Further, in FIG. 4, the light emitting device EU is illustrated in brief based on the unit emission area of the light emitting device EU. Here, the unit emission area may be a unit area to which light is emitted, and may be, for example, an area in which luminance and/or the color of emitted light can be independently adjusted.

Figure 5:
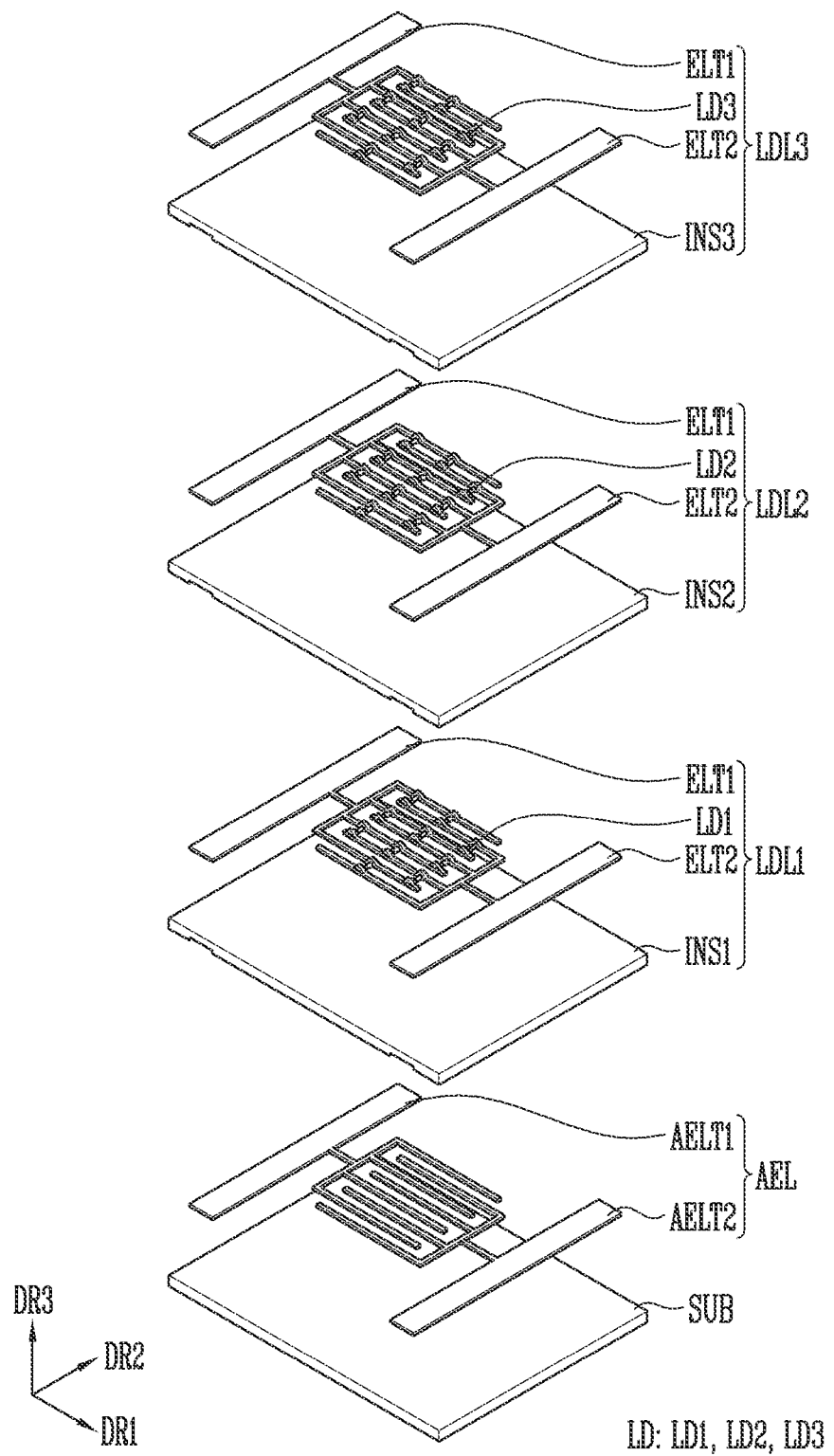
FIG. 5 is an exploded perspective view of the light emitting device of FIG. 4.
Figure 6:
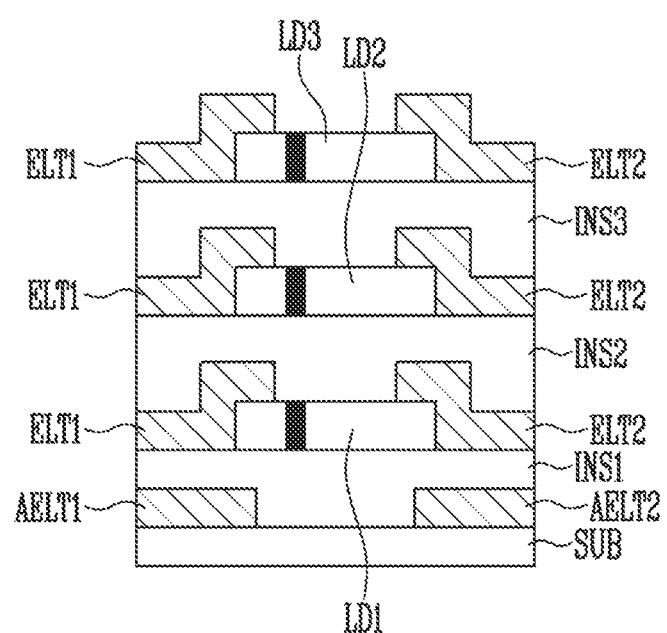
FIG. 6 is a cross-sectional view illustrating an example of a light emitting device taken along the line I-I' of FIG. 4.

FIG. 5 is an exploded perspective view of the light emitting device of FIG. 4. In FIG. 5, layers included in FIG. 4 are separately illustrated. FIG. 6 is a cross-sectional view illustrating an example of a light emitting device taken along the line I-I' of FIG. 4.

Referring to FIGS. 4 to 6, the light emitting device EU may include a substrate SUB, a common electrode layer AEL, and light emitting element layers LDL1, LDL2, and LDL3.

The substrate SUB may form a base member for the light emitting device EU.

In accordance with an embodiment, the substrate SUB may be a rigid or flexible substrate, and the material or properties thereof are not particularly limited. For example, the substrate SUB may be a rigid substrate made of glass or reinforced glass, or a flexible substrate formed of a thin film made of a plastic or metal material. Further, the substrate SUB may be, but is limited to, a transparent substrate. In an example, the substrate SUB may be a translucent substrate, an opaque substrate, or a reflective substrate.

The common electrode layer AEL (or an alignment electrode layer) may be disposed on the substrate SUB, and may include a first common electrode AELT1 (or a first alignment electrode) and a second common electrode AELT2 (or a second alignment electrode).

The first common electrode AELT1 and the second common electrode AELT2 may be arranged in a unit emission area and spaced apart from each other, and may be disposed such that at least portions thereof face each other.

In accordance with embodiments, each of the first common electrode AELT1 and the second common electrode AELT2 may include a stem electrode and at least one branch electrode (herein referred to as a branch electrode). The stem electrode may extend in a second direction DR2 within the corresponding unit emission area. When the light emitting device EU includes a plurality of unit emission areas, the stem electrode extends from the corresponding unit emission area to another unit emission area. The branch electrode may extend from the stem electrode in a first direction DR1 intersecting the second direction DR2. For example, as illustrated in FIG. 5, each of the first and second common electrodes AELT1 and AELT2 may include four branch electrodes branching off from the stem electrode. In an embodiment, the branch electrodes of the first common electrode AELT1 and the branch electrodes of the second common electrode AELT2 may be alternately arranged in the second direction DR2 while being spaced apart from each other by an interval (e.g., a predetermined interval). A separation distance (or an interval) between the branch electrodes of the first common electrode AELT1 and the branch electrodes of the second common electrode AELT2 may be less than or equal to the length of each of the light emitting elements LD, but the separation distance is not limited thereto. The line width and the thickness of each of the first and second common electrodes AELT1 and AELT2 may vary with a voltage applied thereto, but, in an embodiment, the line width of each of the first and second common electrodes AELT1 and AELT2 may be in a range from 100 nm to 50 μm, and the thickness of each of the first and second common electrodes AELT1 and AELT2 may be in a range from 0.1 μm to 10 μm.

However, the shapes and/or the mutual arrangement relationship of the first and second common electrodes AELT1 and AELT2 may be changed in various manners.

Meanwhile, although, in FIG. 5, each of the first and second common electrodes AELT1 and AELT2 is illustrated as including four branch electrodes, the present disclosure is not limited thereto. In an example, in FIG. 5, each of the first and second common electrodes AELT1 and AELT2 may include three or less branch electrodes or five or more branch electrodes, and in another example, the first common electrode AELT1 may include two branch electrodes, and the second common electrode AELT2 may include one branch electrode (see FIG. 16).

Each of the first and second common electrodes AELT1 and AELT2 may include at least one conductive material. In an example, each of the first and second common electrodes AELT1 and AELT2 may include, but is not limited to, a material corresponding to at least one of a metal, such as Ag, Mg, Al, Pt, Pd, Au, Ni, Nd, Ir, Cr, Ti, or alloy thereof, a conductive oxide, such as ITO, IZO, ZnO, or ITZO, and a conductive polymer such as PEDOT.

In embodiments, each of the first and second common electrodes AELT1 and AELT2 may have a single layer or multilayer structure. In an example, the first common electrode AELT1 may have a multilayer structure including a first reflective electrode and a first conductive capping layer, and the second common electrode AELT2 may have a multilayer structure including a second reflective electrode and a second conductive capping layer.

The reflective electrode of each of the first and second common electrodes AELT1 and AELT2 may be made of a conductive material having uniform or substantially uniform reflectivity. In an example, the reflective electrode may include, but is not limited to, at least one of metals, such as Ag, Mg, Al, Pt, Pd, Au, Ni, Nd, Ir, Cr, and alloys thereof.

The light emitting element layers LDL1, LDL2, and LDL3 may be sequentially arranged on the substrate SUB and the common electrode layer AEL along a third direction DR3. Here, the third direction DR3 may be substantially perpendicular to the first and second directions DR1 and DR2.

In embodiments, the light emitting element layers LDL1, LDL2, and LDL3 may include a first light emitting element layer LDL1 (or a first emission unit or a first light emitting electrode assembly), a second light emitting element layer LDL2 (or a second emission unit or a second light emitting electrode assembly) disposed on the first light emitting element layer LDL1, and a third light emitting element layer LDL3 (or a third emission unit or a third light emitting electrode assembly) disposed on the second light emitting element layer LDL2. However, the light emitting element layers LDL1, LDL2, and LDL3 are not limited thereto, and the light emitting element layers LDL1, LDL2, and LDL3 may include two, or four or more light emitting element layers. Herein, on the assumption that the light emitting device EU includes the first light emitting element layer LDL1, the second light emitting element layer LDL2, and the third light emitting element layer LDL3, the first to third light emitting element layers LDL1, LDL2, and LDL3 will be described.

Each of the first to third light emitting element layers LDL1, LDL2, and LDL3 may include an insulating layer INS, a first electrode ELT1, a second electrode ELT2, and light emitting elements LD. Here, each of the light emitting elements LD may be a rod-type light emitting diode according to any of the embodiments of FIGS. 1A to 3B. Since the first to third light emitting element layers LDL1, LDL2, and LDL3 may be substantially the same or similar to each other, the first to third light emitting element layers LDL1, LDL2, and LDL3 will be comprehensively described based on the first light emitting element layer LDL1.

The first light emitting element layer LDL1 may be disposed on the substrate SUB, and may include a first insulating layer INS1, first and second electrodes ELT1 and ELT2, and first light emitting elements LD1.

The first insulating layer INS1 may be disposed on the substrate SUB and the common electrode layer AEL. For example, the first insulating layer INS1 may cover at least a portion of each of the first and second common electrodes AELT1 and AELT2, or may be disposed on the overall surface of the substrate SUB.

The first insulating layer INS1 may be formed in a single layer or multilayer structure, and may include at least one inorganic insulating material and/or at least one organic insulating material. For example, the first insulating layer INS1 may include any of various types of well-known organic/inorganic insulating materials, including $SiN_x$, and the material forming the first insulating layer INS1 is not particularly limited.

The first light emitting elements LD1 may be disposed on the first insulating layer INS1.

In an embodiment, each of the light emitting elements LD (or first light emitting elements LD1) may be a light emitting diode that is made of a material having an inorganic crystal structure and that has a subminiature size, for example, in an range from a nanoscale to a microscale size. For example, each of the light-emitting elements LD may be a subminiature rod-type light emitting diode, which is illustrated in any of FIGS. 1A to 3B and has a size in a range from a nanoscale to a microscale. However, the types of light emitting elements LD that can be applied to the present disclosure are not limited thereto. For example, each of the light emitting elements LD may be formed in the type of growth, and may be, for example, a light emitting diode having a core-shell structure of a size in an range from a nanoscale to a microscale.

In an embodiment, the light emitting elements LD may be disposed between the first common electrode AELT1 and the second common electrode AELT2 (or between the first electrode ELT1 and the second electrode ELT2) facing each other in a plan view. The light emitting elements LD may be aligned (or arranged) in the second direction DR2, and, in other words, a longitudinal direction of the light emitting elements LD may be the same as the second direction DR2. However, the alignment direction of the light emitting elements LD is not limited thereto. For example, at least one of the light emitting elements LD may be arranged in a diagonal direction.

In an embodiment, each of the first, second, and third light emitting element layers LDL1, LDL2, and LDL3 emits monochromatic light, wherein at least some of the first, second, and third light emitting element layers LDL1, LDL2, and LDL3 may emit light in different colors (or monochromatic colors).

For example, the first light emitting element layer LDL1 may include first light emitting elements LD1 which emit light in a first color, the second light emitting element layer LDL2 may include second light emitting elements LD2 which emit light in a second color, and the third light emitting element layer LDL3 may include third light emitting elements LD3 which emit light in a third color. For example, each of the first light emitting elements LD1 may be a red light emitting diode which emits light in red, each of the second light emitting elements LD2 may be a green light emitting diode which emits light in green, and each of the third light emitting elements LD3 may be a blue light emitting diode which emits light in blue.

However, the first to third light emitting element layers LDL1, LDL2, and LDL3 are not limited thereto, and the first to third light emitting element layers LDL1, LDL2, LDL3 (or the first to third light emitting elements LD1, LD2, and LD3) may emit light in the same color.

The light emitting elements LD may be coupled in parallel to each other through the first and second electrodes ELT1 and ELT2 in the corresponding light emitting element layer.

The light emitting elements LD may be disposed between the first and second electrodes ELT1 and ELT2. Also, each of the light emitting elements LD may be disposed between the first and second electrodes ELT1 and ELT2 and the first insulating layer INS1, a first end of each of the light emitting elements LD may be in contact with or coupled to the first electrode ELT1, and a second end of each of the light emitting elements LD may be in contact with or coupled to the second electrode ELT2.

The light emitting elements LD arranged in a unit emission area may be gathered to form one light source (or one pixel PXL). In an example, when a driving current flows through the light emitting device EU (or one pixel PXL) during each frame period, the light emitting elements LD coupled in a forward direction between the first and second electrodes ELT1 and ELT2 of the sub-pixel may emit light with luminance corresponding to the driving current.

The first electrode ELT1 and the second electrode ELT2 may be arranged in the unit emission area and spaced apart from each other, and may be disposed such that at least portions thereof face each other. The shapes and arrangement relationship of the first and second electrodes ELT1 and ELT2 may be substantially the same or similar to those of the first and second common electrodes AELT1 and AELT2. At least one of the first electrode ELT1 and the second electrode ELT2 may be separated from the first and second common electrodes AELT1 and AELT2, and may be electrically isolated from the first and second common electrodes AELT1 and AELT2 by the first insulating layer INS1 (or the insulating layer INS). In this case, when a voltage (e.g., an alternating current (AC) voltage) for aligning the light emitting elements LD is applied to the first and second common electrodes AELT1 and AELT2, the light emitting elements LD coupled between the first and second electrodes ELT1 and ELT2 may be prevented or substantially prevented from being damaged by the voltage. However, the present disclosure is not limited thereto, and, for example, the first electrode ELT1 may be electrically decoupled from the first common electrode AELT1, but the second electrode ELT2 may be electrically coupled to the second common electrode AELT2.

In accordance with embodiments, the first electrode ELT1 may include at least one first sub-electrode ELT_S1 (herein referred to as a first sub-electrode ELT_S1), and the second electrode ELT2 may include at least one second sub-electrode ELT_S2 (herein referred to as a second sub-electrode ELT_S2). The first sub-electrode ELT_S1 and the second sub-electrode ELT_S2 may extend in the first direction DR1 in a unit emission area, and may be arranged in parallel to each other in the second direction DR2 while being spaced apart from each other by an interval (e.g., a predetermined interval).

The first sub-electrode ELT_S1 may overlap the branch electrodes of the first common electrode AELT1, and the second sub-electrode ELT_S2 may overlap the branch electrodes of the second common electrode AELT2. In an embodiment, the first sub-electrode ELT_S1 may have a line width the same as that of the branch electrodes of the first common electrode AELT1, and may fully overlap the first common electrode AELT1. Similarly, in an embodiment, the second sub-electrode ELT_S2 may have a line width the same as that of the branch electrodes of the second common electrode AELT2, and may fully overlap the second common electrode AELT2.

In accordance with embodiments, the first electrode ELT1 may further include a first connection electrode CNL1 coupled to the first sub-electrode ELT_S1. For example, the first connection electrode CNL1 may extend in the second direction DR2, and may be coupled to be integrated with the first sub-electrode ELT_S1. For example, the first sub-electrode ELT_S1 may be formed by branching from the first connection electrode CNL1 into at least one part. In an embodiment, when the first sub-electrode ELT_S1 and the first connection electrode CNL1 are formed to be integrated with each other, the first connection electrode CNL1 may be regarded as an area of the first electrode ELT1. However, the present disclosure is not limited thereto. For example, in another embodiment of the present disclosure, the first sub-electrode ELT_S1 and the first connection electrode CNL1 may be separately formed, and may then be electrically coupled to each other through at least one contact hole or via hole, which is not illustrated.

The first connection electrode CNL1 may overlap the stem electrode of the first common electrode AELT1, but the present disclosure not limited thereto. For example, the first connection electrode CNL1 may have a line width different from that of the first common electrode AELT1, and may partially overlap the first connection electrode CNL1 or may not overlap the first connection electrode CNL1.

Similarly, the second electrode ELT2 may further include a second connection electrode CNL2 coupled to the second sub-electrode ELT_S2. Since the arrangement of the second connection electrode CNL2 and the coupling relationship with the second sub-electrode ELT_S2 may be substantially the same as the arrangement of the first connection electrode CNL1 and the coupling relationship with the first sub-electrode ELT_S1, repeated descriptions thereof will be omitted. The second connection electrode CNL2 may extend from the corresponding unit emission area to other unit emission areas.

In an embodiment, the first electrode ELT1 may be formed on first ends of the light emitting elements LD, and may then be physically and/or electrically coupled to the first ends of the light emitting elements LD. Similarly, the second electrode ELT2 may be formed on second ends of the light emitting elements LD, and may then be physically and/or electrically coupled to the second ends of the light emitting elements LD.

In an embodiment, the first and second electrodes ELT1 and ELT2 may include one or more metal materials selected from the group consisting of aluminum (Al), titanium (Ti), indium (In), gold (Au), and silver (Ag), or one or more transparent materials selected from the group consisting of indium tin oxide (ITO), ZnO:Al, and CNT-conducting polymer composite. When the first and second electrodes ELT1 and ELT2 include two or more types of electrode-forming materials, the first and second electrodes ELT1 and ELT2 may have a structure in which the two or more types of electrode-forming materials are stacked.

As described above with reference to FIGS. 4 to 6, the light emitting device EU according to embodiments of the present disclosure may include a plurality of stacked light emitting element layers LDL1, LDL2, and LDL3 (or emission units or light emitting electrode assemblies). An emission unit may include light emitting element layers LDL1, LDL2, and LDL3 having a three-dimensional stacked structure. Therefore, in a limited area (i.e., a unit emission area), the number of light emitting elements LD mounted per unit area may be increased, and the luminance of the light emitting device EU (or the display device) may be improved.

Further, when the light emitting element layers LDL1, LDL2, and LDL3 configure red, green, and blue sub-pixels, respectively, one pixel (i.e., a pixel which emits full color light) may form a full color light emitting device EU in a single unit emission area. That is, light emitting element layers LDL1, LDL2, and LDL3 of different colors are arranged in a limited area (i.e., a unit emission area), and, thus, a light emitting device (or a display device) having high resolution (or high definition) may be implemented.

FIGS. 7A to 7I are views for explaining a process of manufacturing the light emitting device of FIG. 4.

Figure 7A:
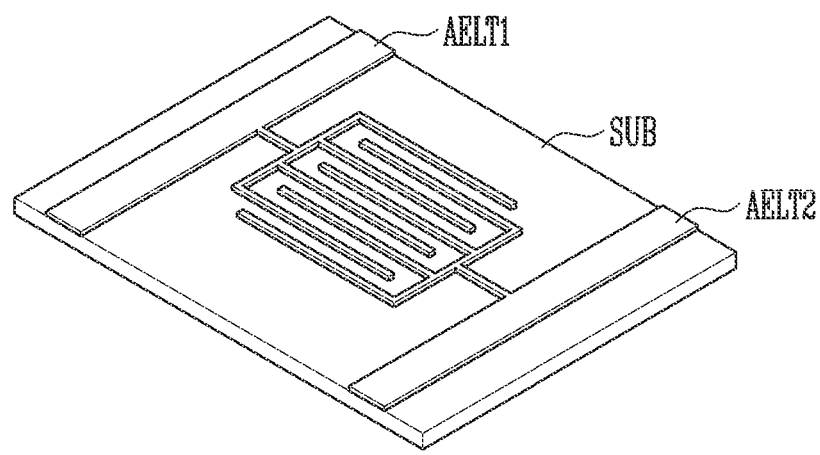
FIGS. 7A to 7I are views for explaining a process of manufacturing the light emitting device of FIG. 4, according to an embodiment of the present disclosure.

Referring to FIGS. 4 and 7A, first and second common electrodes AELT1 and AELT2 (or a common electrode layer AEL) may be formed on a substrate SUB (or in a unit emission area of the substrate SUB).

The area and shape of the substrate SUB are not limited, and may vary in consideration of the areas of the first and second common electrodes AELT1 and AELT2 to be formed on the substrate SUB, the size of light emitting elements LD, the number of light emitting elements to be mounted, etc. In an embodiment, the thickness of the substrate SUB may be 100 μm to 1 mm. In an embodiment, the area (or the area of a unit electrode) of the first and second common electrodes AELT1 and AELT2 may be 10 μm$^2$ to 100 cm$^2$.

Figure 7B:
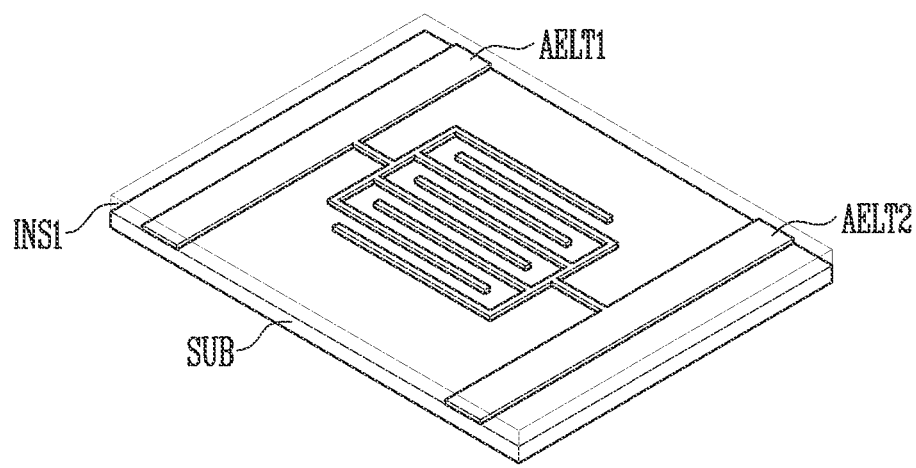

Thereafter, as illustrated in FIG. 7B, a first insulating layer INS1 may be formed on the first and second common electrodes AELT1 and AELT2.

In accordance with an embodiment, the first insulating layer INS1 may be formed through any of plasma enhanced chemical vapor deposition (PECVD), e-beam deposition, atomic layer deposition, and sputtering deposition, but the present disclosure is not limited thereto.

In an embodiment, the first insulating layer INS1 may include at least one material selected from among $SiO_2$, $Si_3N_4$, $SiN_x$, $Al_2O_3$, $HfO_2$, $Y_2O_3$, and $TiO_2$. In an embodiment, the first insulating layer INS1 may have a thickness of 1 nm to 100 μm, and may be varied with the voltage of a power supply (e.g., an alignment voltage) applied to the first and second common electrodes AELT1 and AELT2, the length of the light emitting elements LD, a distance between the first and second common electrodes AELT1 and AELT2, or the like.

Figure 7C:
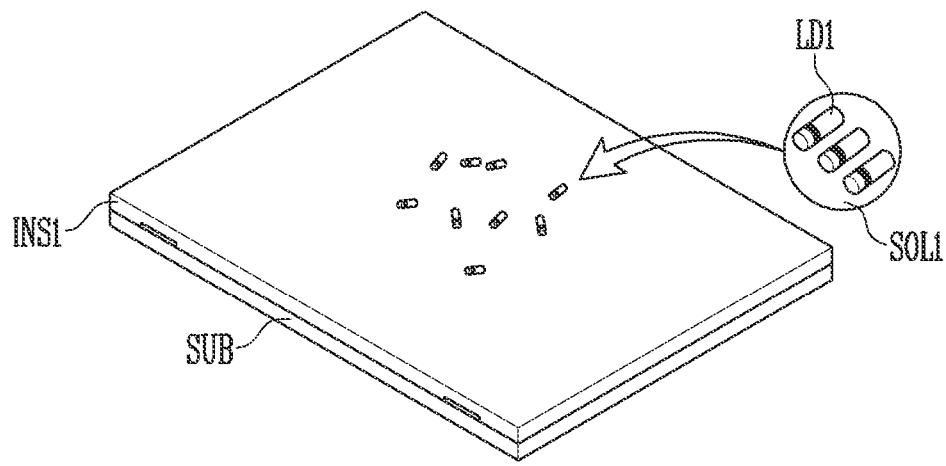

Thereafter, as illustrated in FIG. 7C, the first light emitting elements LD1 may be prepared in a diffused form in a first solution SOL1, and may be provided on the first insulating layer INS1.

In an embodiment, the first solution SOL1 may be manufactured by mixing the first light emitting elements LD1 with a dispersion solvent. The dispersion solvent may have the form of ink or paste, and the solvent may be, as a volatile solvent, at least one selected from among acetone, water, alcohol, and toluene. However, the type of dispersion solvent is not limited to the above-described type, and any type of solvent may be used without limitation as long as the solvent is a solvent that can be desirably evaporated without exerting physical and chemical influences on the first light emitting elements LD1. In an embodiment, the first solution SOL1 may include the first light emitting elements LD1 corresponding to 0.001 to 100 weight % to the weight of the dispersion solvent. When the first solution SOL1 includes the first light emitting elements LD1 corresponding to less than 0.001 weight %, the number of first light emitting elements LD1 coupled to the electrodes (e.g., first and second electrodes ELT1 and ELT2) may be small. When the first solution SOL1 includes first light emitting elements LD1 corresponding to more than 100 weight %, the alignment between the first light emitting elements LD1 may be interrupted.

Figure 7D:
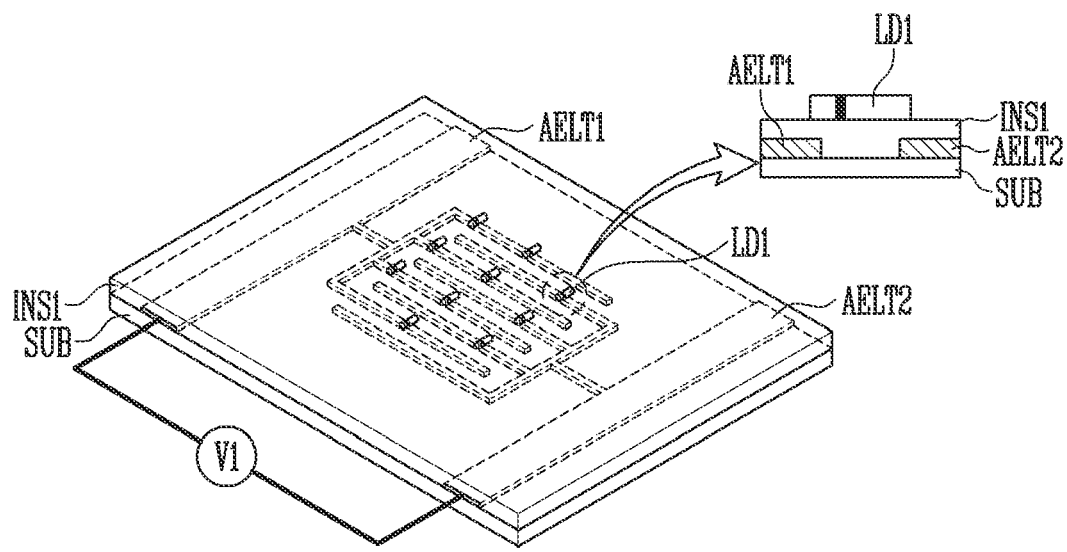

Thereafter, as illustrated in FIG. 7D, when a voltage (e.g., a predetermined voltage) is supplied to the first and second common electrodes AELT1 and AELT2, an electric field is formed between the first and second common electrodes AELT1 and AELT2, and the first light emitting elements LD1 may be self-aligned between the first and second common electrodes AELT1 and AELT2 on the plan view. When the first light emitting elements LD1 have been aligned, the solvent is volatilized or removed using other additional methods, and, thus, the light emitting elements LD may be stably arranged on the first insulating layer INS1.

For example, when a first voltage V1 is supplied between the first and second common electrodes AELT1 and AELT2, an electric field may be formed between the first and second common electrodes AELT1 and AELT2, and, thus, polarization may occur in the first light emitting elements LD1. Accordingly, the first light emitting elements LD1 may be arranged with an orientation tendency by an electrostatic attraction between adjacent common electrodes AELT1 or AELT2. When the first common electrode AELT1 is a positive pole and the second common electrode AELT2 is a negative pole, first ends of the first light emitting elements LD1, having negative charges, may be disposed on the first insulating layer INS1 in accordance with the location of the first common electrode AELT1, and second ends thereof, having positive charges, may be disposed on the first insulating layer INS1 in accordance with the location of the second common electrode AELT2.

In embodiments, the first voltage V1 may have a voltage level of 0.1 V to 2,000 V. Men the voltage level of the first voltage V1 is less than 0.1 V, the alignment efficiency of the first light emitting elements LD1 may be deteriorated. When the voltage level of the first voltage V1 is greater than 2,000 V, the first insulating layer INS1 may be broken, and a leakage current, an electrical short circuit, or electrode damage may occur. In an embodiment, the frequency of the first voltage V1 may be in a range from 10 Hz to 100 GHz, and the first voltage V1 may be, for example, a sine wave having a frequency of 90 kHz to 100 MHz. When the frequency is less than 10 Hz, the number of first light emitting elements LD1 that are mounted may be greatly decreased, and the orientation of the first light emitting elements LD1 may be very irregular. When the frequency is greater than 100 GHz, the first light emitting elements LD1 does not adapt to rapidly changing AC power, and, thus, the mountability of the first light emitting elements LD1 may be decreased, and orientation tendency may also be decreased.

Figure 7E:
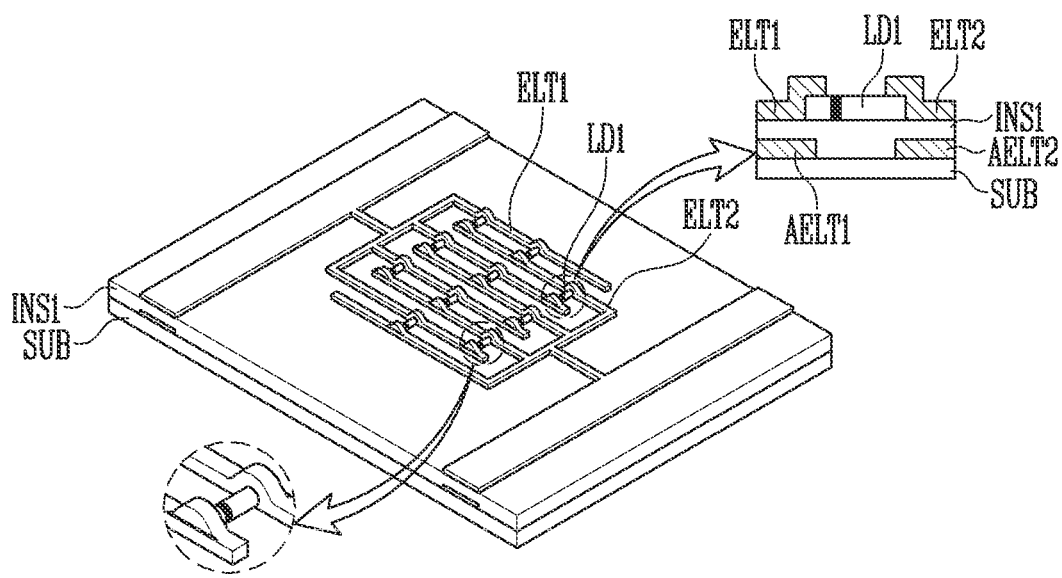

Thereafter, as illustrated in FIG. 7E, a first electrode ELT1 and a second electrode ELT2 may be respectively formed on the opposite ends of each of the first light emitting elements LD1. The first light emitting elements LD1 may be stably coupled between the first and second electrodes ELT1 and ELT2. A process of forming the first and second electrodes ELT1 and ELT2 will be described later with reference to FIGS. 8A to 8E.

Figure 7F:
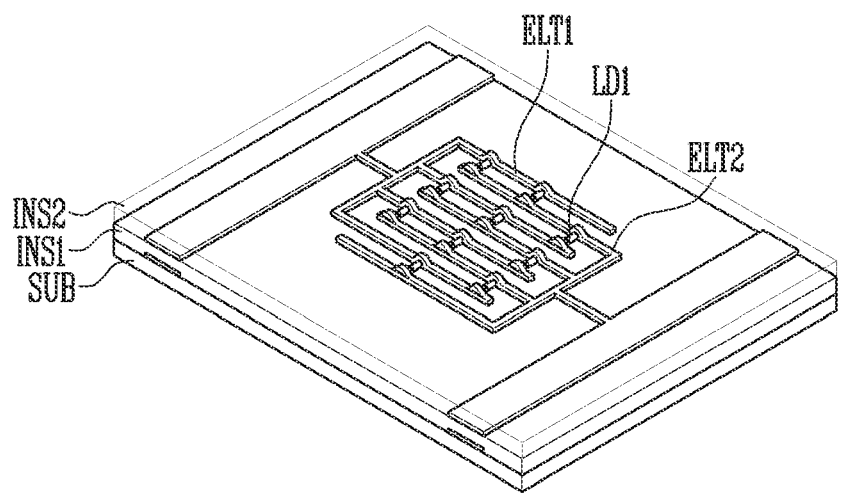

Thereafter, as illustrated in FIG. 7F, a second insulating layer INS2 may be formed on the first light emitting element layer LDL1 (i.e., the first insulating layer INS1, the first light emitting elements LD1, and the first and second electrodes ELT1 and ELT2). A method of forming the second insulating layer INS2 may be the same or similar to the method of forming the first insulating layer INS1.

Figure 7G:
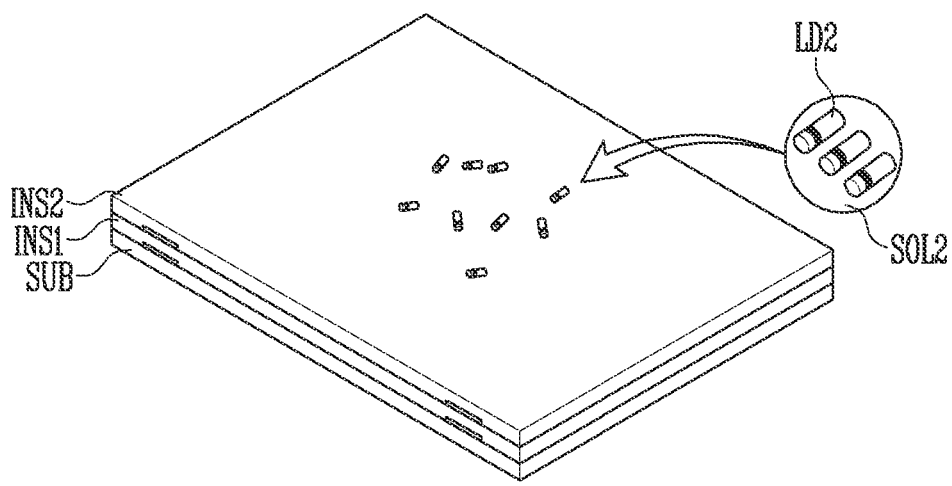
Figure 7H:
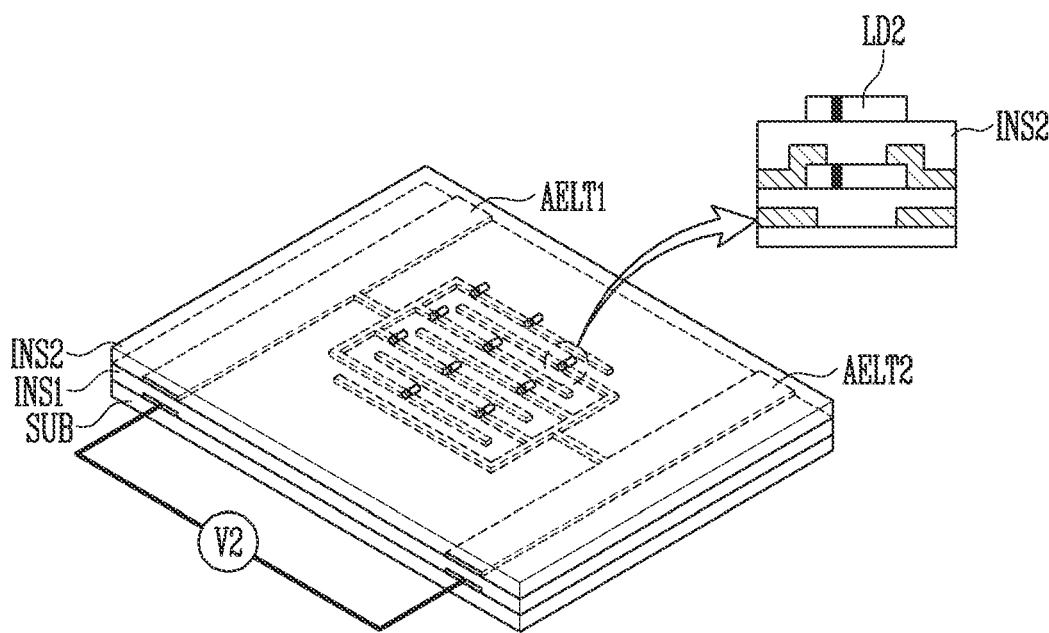
Figure 7I:
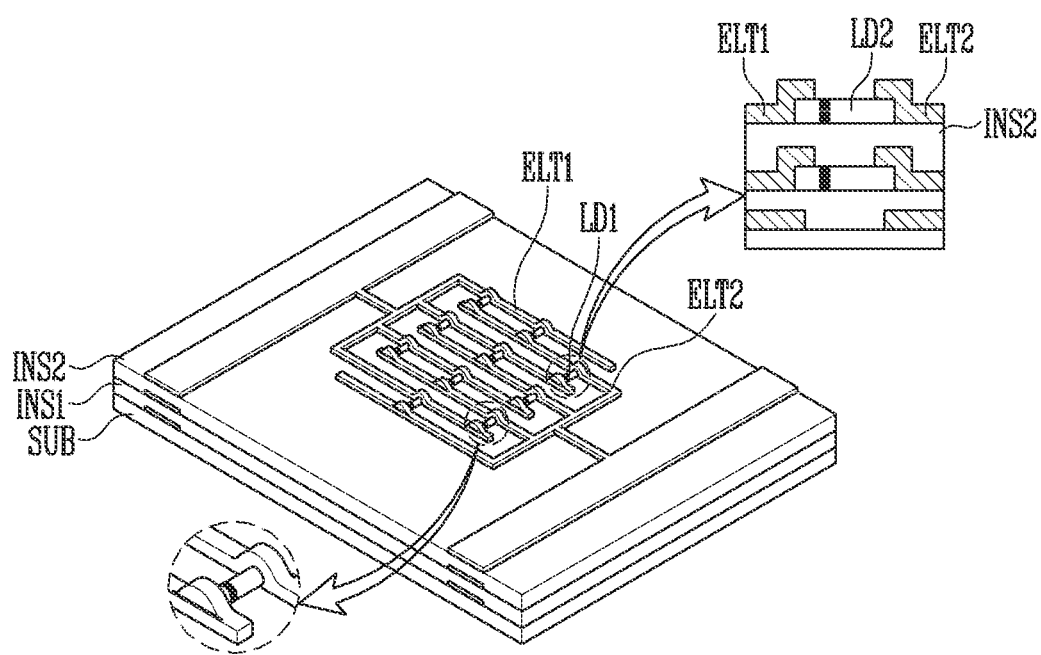

Thereafter, as illustrated in FIG. 7G, second light emitting elements LD2 may be prepared in a diffused form in a second solution SOL2, and may then be provided on the second insulating layer INS2. Thereafter, as illustrated in FIG. 7H, when a second voltage V2 is supplied to the first and second common electrodes AELT1 and AELT2, an electric field is formed between the first and second common electrodes AELT1 and AELT2, and the second light emitting elements LD2 may be self-aligned between the first and second common electrodes AELT1 and AELT2 on the plan view. Thereafter, as illustrated in FIG. 7I, a first electrode ELT1 and a second electrode ELT2 may be respectively formed on the opposite ends of each of the second light emitting elements LD2.

That is, the process of forming the first light emitting element layer LDL1 (see FIG. 5) illustrated in FIGS. 7B to 7E may be repeated once, and, thus, the second light emitting element layer LDL2 (see FIG. 5) may be formed. Similarly, the process of forming the second light emitting element layer LDL2 (see FIG. 5) illustrated in FIGS. 7F to 7I may be repeated once more, and, thus, the third light emitting element layer LDL3 (see FIG. 5) may be formed.

In embodiments, the second voltage V2 that is applied to the first and second common electrodes AELT1 and AELT2 when the second light emitting element layer LDL2 is formed may have a voltage level and/or a frequency higher than those of the first voltage V1 that is applied to the first and second electrodes AELT1 and AELT2 when the first light emitting element layer LDL1 is formed. That is, since an electric field can be relatively reduced when the second light emitting element layer LDL2 is formed, reduction in an electric field may be compensated for by increasing the voltage level and/or the frequency of the second voltage V2, and the number of second light emitting elements LD2 to be mounted on the second light emitting element layer LDL2 may be adjusted to the number of first light emitting elements LD1. Similarly, a third voltage that is applied to the first and second common electrodes AELT1 and AELT2 when the third light emitting element layer LDL3 is formed may have a voltage level and/or a frequency higher than those of the second voltage V2 that is applied to the first and second electrodes AELT1 and AELT2 when the second light emitting element layer LDL2 is formed. However, the present disclosure is not limited thereto, and, in an embodiment, the first voltage V1, the second voltage V2, and the third voltage may have the same voltage level and frequency.

FIGS. 8A to 8E are views for explaining a process of forming first and second electrodes of FIG. 7E. Since the process of forming the first and second electrodes ELT1 and ELT2 in FIGS. 8A to 8E may be applied to each of the first to third light emitting element layers LDL1, LDL2, and LDL3, a configuration disposed under the first and second electrodes ELT1 and ELT2 (e.g., a substrate SUB, an additional light emitting element layer, etc.) are illustrated in brief as a common electrode layer AEL in FIGS. 8A to 8E.

Figure 8A:
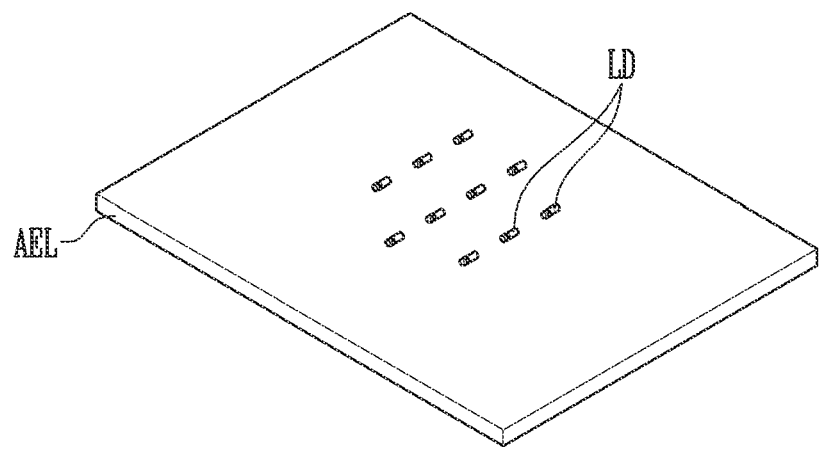
FIGS. 8A to 8E are views for explaining a process of forming first and second electrodes of FIG. 7E, according to an embodiment of the present disclosure.

First, referring to FIGS. 7E and 8A, a common electrode layer AEL having a surface on which light emitting elements LD are aligned may be prepared.

Figure 8B:
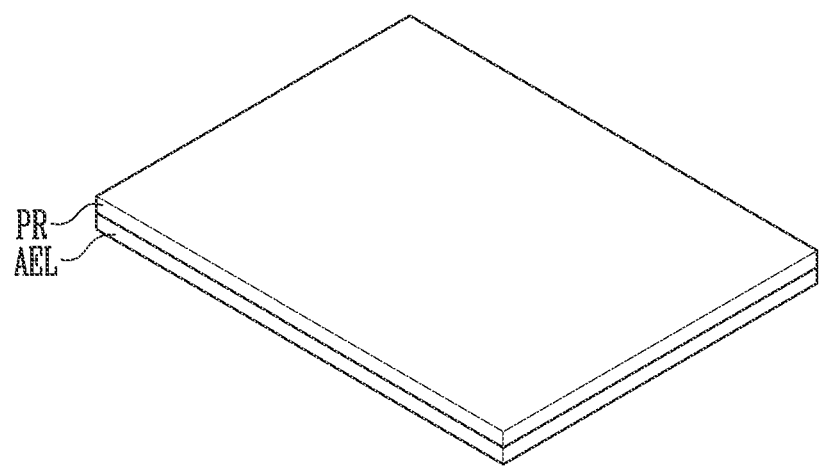

As illustrated in FIG. 8B, the common electrode layer AEL may be coated with a photoresist, or alternatively, a photoresist layer PR may be formed on the common electrode layer AEL. The photoresist layer PR may include a photoresist that is typically used in the art. In an embodiment, the common electrode layer AEL may be coated with a photoresist through any of spin coating, spray coating, and screen printing. The thickness of the photoresist layer PR may be varied in consideration of the thickness of the first and second electrodes ELT1 and ELT2 to be formed on the common electrode layer AEL, and may be, for example, 0.1 µm to 10 µm. However, the present disclosure is not limited thereto.

Figure 8C:
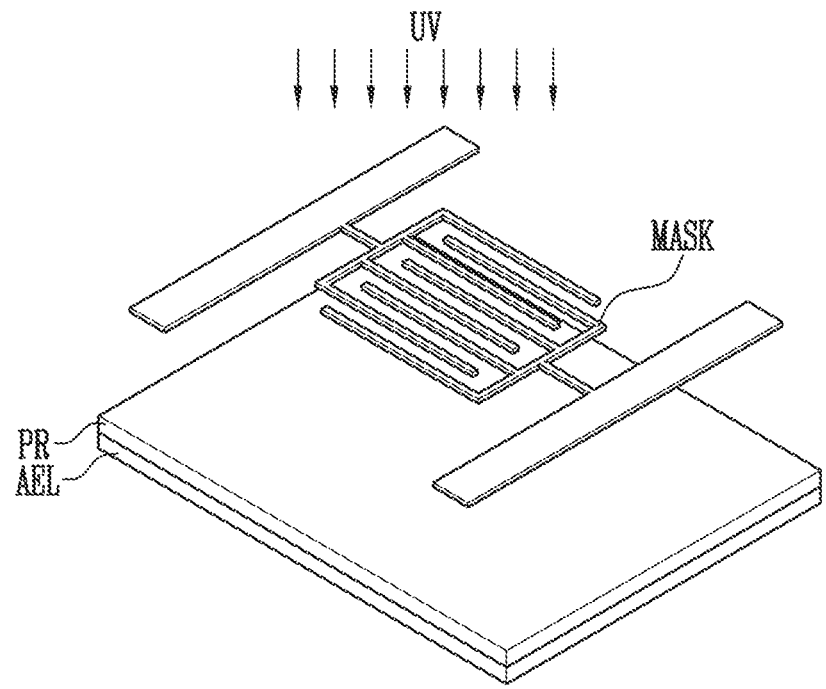

Thereafter, as illustrated in FIG. 8C, a mask MASK in which a pattern corresponding to the first and second electrodes ELT1 and ELT2 is printed may be disposed on the photoresist layer PR, and the top of the mask MASK may be exposed to ultraviolet rays (or ultraviolet radiation) UV.

Figure 8D:
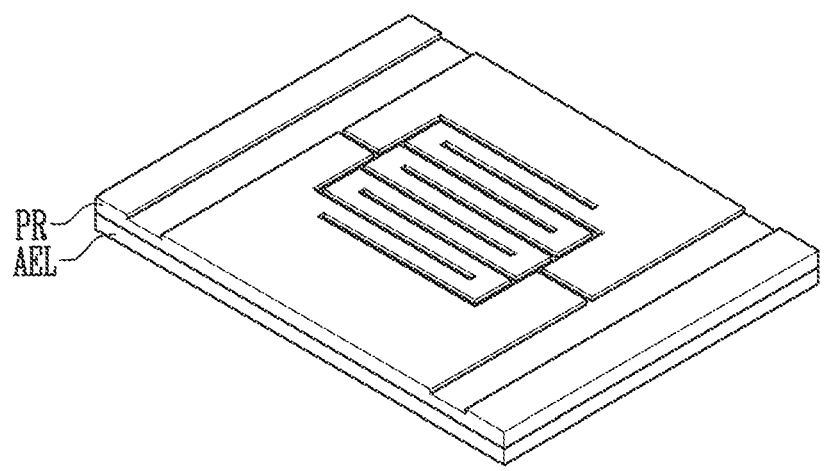

Thereafter, as illustrated in FIG. 8D, the photoresist layer PR is immersed in a typical photoresist solvent, thus enabling the exposed portion of the photoresist layer PR to be removed. That is, the portion of the photoresist layer PR, in which the first and second electrodes ELT1 and ELT2 are to be formed, may be removed.

Figure 8E:
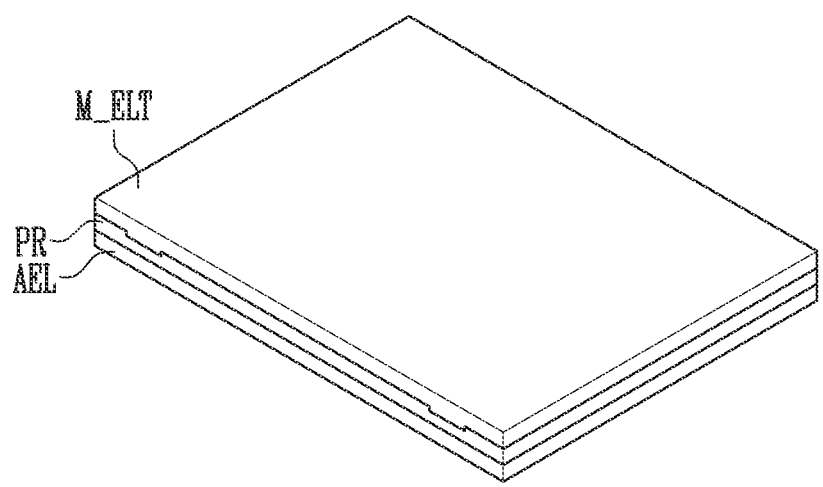

Thereafter, as illustrated in FIG. 8E, an electrode forming material M_ELT may be deposited on the photoresist layer PR. The electrode forming material M_ELT may be the same as the material forming the first and second electrodes ELT1 and ELT2.

After the electrode forming material M_ELT has been deposited, the photoresist layer PR formed on the common electrode layer AEL may be removed using a photoresist remover. In an embodiment, the photoresist remover may be any of acetone, N-Methyl pyrrolidone (1-Methyl-2-pyrrolidone (NMP)), and dimethyl sulfoxide (DMSO).

As the photoresist layer PR is removed, first and second electrodes ELT1 and ELT2 may be formed on the common electrode layer AEL.

Meanwhile, although it is illustrated in FIGS. 8A to 8E that the first and second electrodes ELT1 and ELT2 are manufactured, the present disclosure is not limited thereto. The manufacturing method in FIGS. 8A to 8E may also be applied to first and second common electrodes AELT1 and AELT2. That is, the first and second common electrodes AELT1 and AELT2 and the first and second electrodes ELT1 and ELT2 may be formed using the same manufacturing method.

Figure 9:
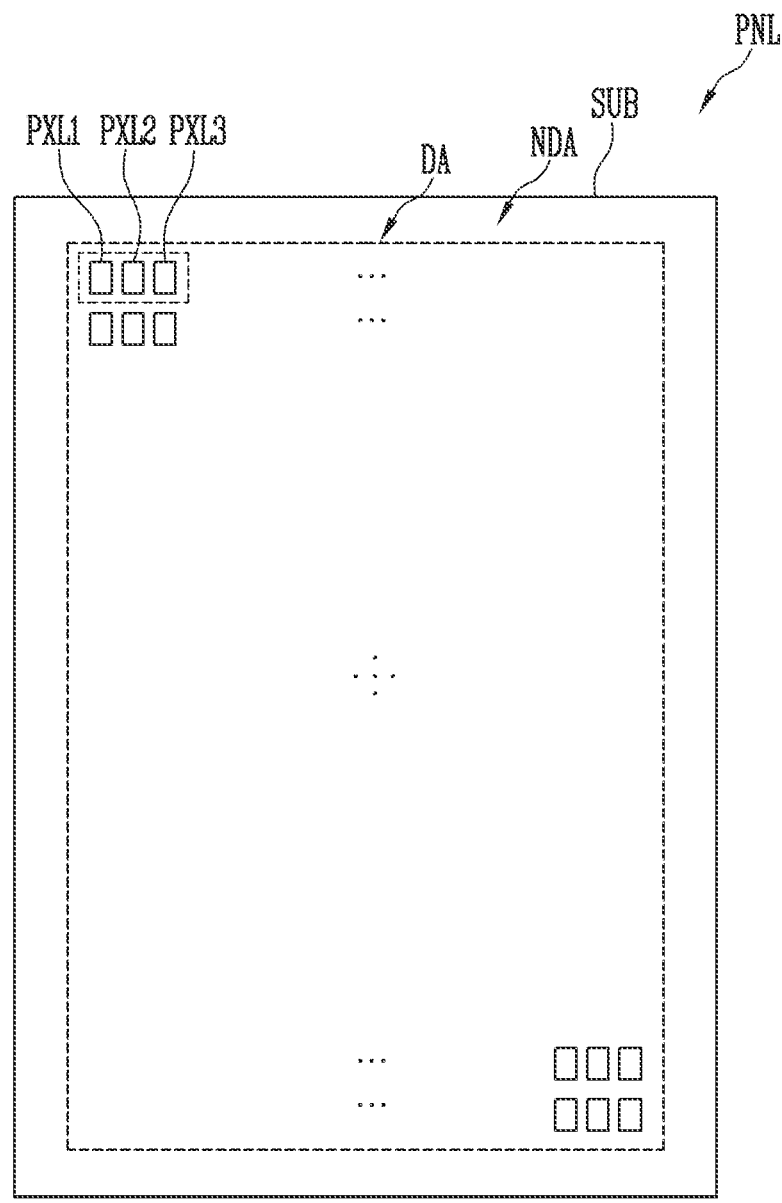
FIG. 9 is a plan view illustrating a display device according to an embodiment of the present disclosure.

FIG. 9 is a plan view illustrating a display device according to an embodiment of the present disclosure. In an embodiment, in FIG. 9, a display device, for example, a display panel PNL provided in the display device, is illustrated as an example of a device that can use the light emitting elements LD, described with reference to FIGS. 1A to 3B, or the light emitting device EU, described with reference to FIG. 4, as a light source. In accordance with an embodiment, FIG. 9 illustrates in brief a structure of the display panel PNL based on a display area DA. However, in some embodiments, at least one driving circuit (e.g., at least one of a scan driver and a data driver), which is not illustrated, and/or a plurality of lines may be further provided on the display panel PNL.

Referring to FIG. 9, the display panel PNL may include a substrate SUB and pixels PXL disposed on the substrate SUB. In further detail, the display panel PNL and the substrate SUB may include a display area DA in which an image is displayed, and a non-display area NDA other than the display area DA.

In an embodiment, the display area DA may be disposed in a central portion of the display panel PNL, and the non-display area NDA may be disposed along a perimeter portion of the display panel PNL in such a way as to enclose the display area DA. However, the locations of the display area DA and the non-display area NDA are not limited thereto, and may be varied.

The substrate SUB may form a base member for the display panel PNL. For example, the substrate SUB may form a base member of a lower panel (e.g., a lower plate of the display panel PNL). Since the substrate SUB may be the same or similar to the substrate SUB, described above with reference to FIG. 4, repeated descriptions thereof will be omitted.

An area on the substrate SUB is defined as the display area DA in which the pixels PXL are disposed, and the other area thereof is defined as the non-display area NDA. For example, the substrate SUB may include the display area DA including a plurality of pixel areas in which the pixels PXL (or pixels PXL1, PXL2, and PXL3) are formed, and the non-display area NDA disposed around the display area DA. Various lines and/or internal circuits which are coupled to the pixels PXL of the display area DA may be disposed in the non-display area NDA.

Each pixel PXL may include at least one light emitting element LD driven in response to the corresponding scan signal and the corresponding data signal, for example, at least one rod-type light emitting diode according to any of the embodiments shown in FIGS. 1A to 3B. A plurality of rod-type light emitting diodes may form a light source of the pixel PXL.

Also, the pixel PXL may include light emitting element layers having a three-dimensional structure. For example, the pixel PXL may have a structure substantially the same as the light emitting device EU, described above with reference to FIG. 4.

Although, in FIG. 9, an embodiment in which the pixels PXL are arranged in the form of stripes in the display area DA is illustrated, the present disclosure is not limited thereto. For example, the pixels PXL may be arranged in the form of any of various well-known pixel arrays.

In an embodiment, the pixels PXL may be configured as active pixels. However, the types, the structures, and/or the driving schemes of the pixels PXL applicable to the display device according to the present disclosure are not particularly limited. For example, each pixel PXL may be implemented as a pixel of a display device having any of various well-known passive or active structures.

Figure 10A:
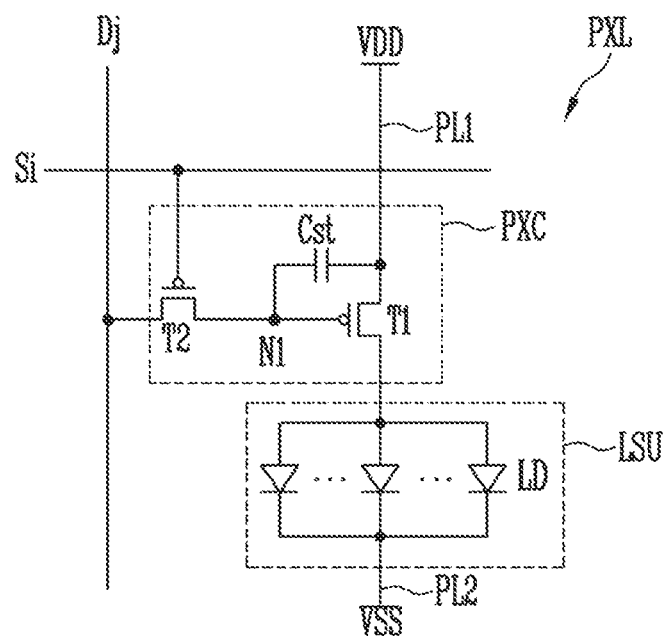
FIGS. 10A to 10C are circuit diagrams illustrating an example of a pixel included in the display device of FIG. 9.
Figure 10B:
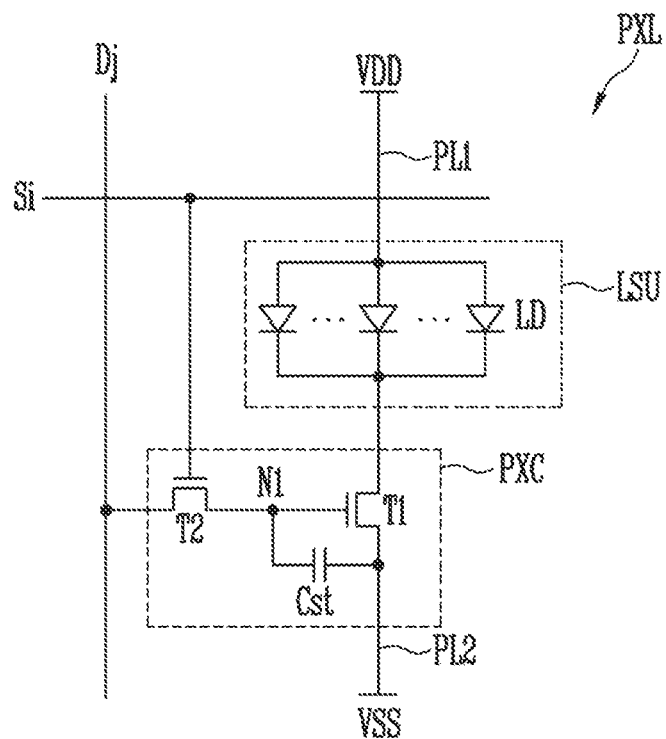
Figure 10C:
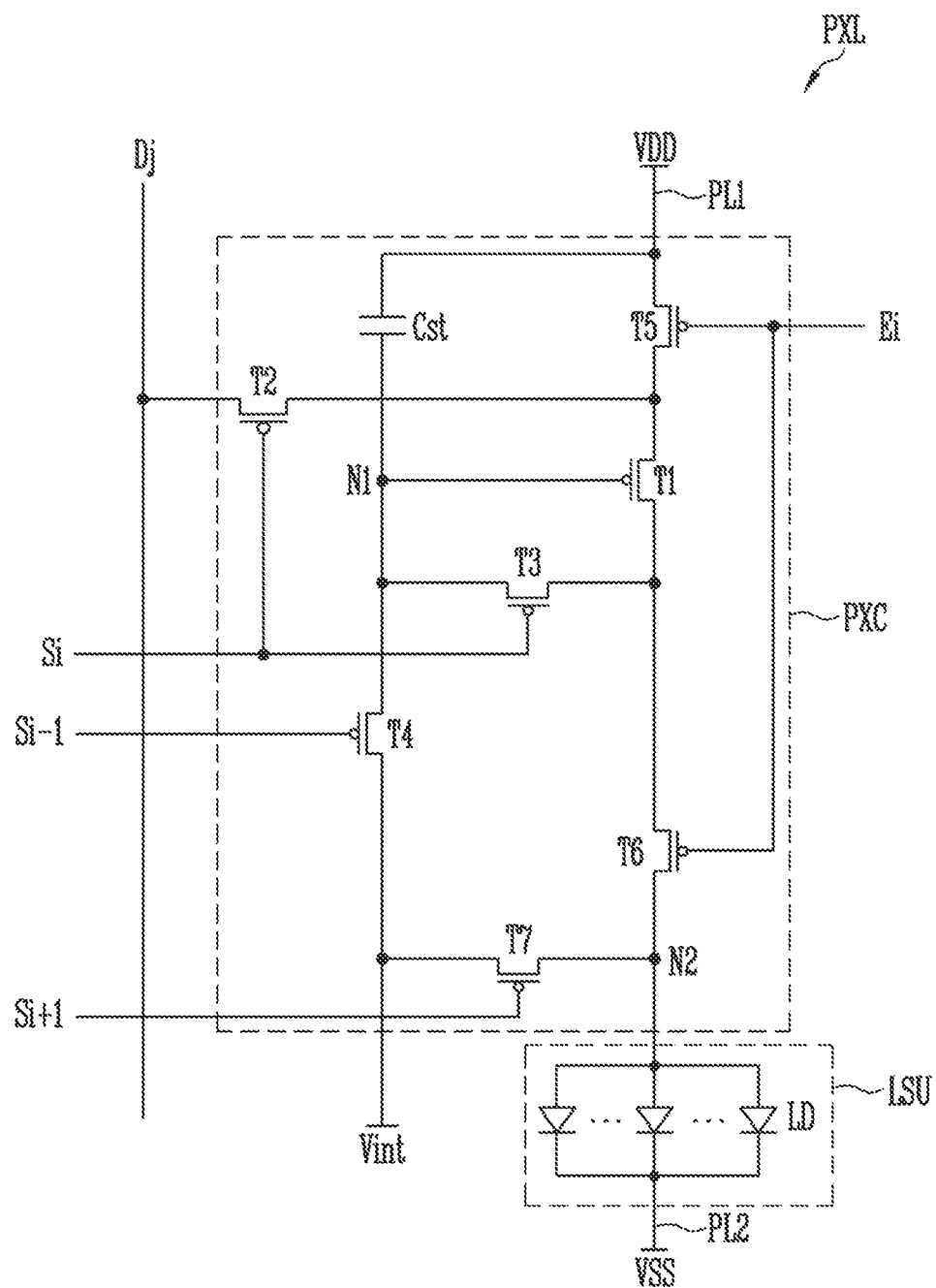

FIGS. 10A to 10C are circuit diagrams illustrating an example of a pixel included in the display device of FIG. 9. In FIGS. 10A to 10C, different embodiments of the pixel PXL that can be provided in an active display device (e.g., an active light emitting display device) are illustrated.

First, referring to FIG. 10A, the pixel PXL may include an emission unit LSU and a pixel circuit PXC for driving the emission unit LSU. Since the pixel PXL includes a plurality of light emitting element layers (e.g., first to third light emitting element layers LDL1, LDL2, and LDL3), described above with reference to FIG. 4, the pixel PXL may include a plurality of emission units corresponding to light emitting element layers and a plurality of pixel circuits (e.g., three pixel circuits) for mutually independently driving the emission units (e.g., first to third light emitting element layers LDL1, LDL2, and LDL3).

In an embodiment, the emission unit LSU may include a plurality of light emitting elements LD coupled in parallel to each other between first and second power supplies VDD and VSS. Here, the first and second power supplies VDD and VSS may have different potentials. For example, the first power supply VDD may be set as a high-potential power supply, and the second power supply VSS may be set as a low-potential power supply. Here, a potential difference between the first and second power supplies VDD and VSS may be set to a threshold voltage or more of the light emitting elements LD during at least a light emitting period of the pixel PXL.

Although it is illustrated in FIG. 10A that the light emitting elements LD are coupled in parallel to each other in the same direction (e.g., forward direction) between the first power supply VDD and the second power supply VSS, the present disclosure is not limited thereto. For example, some of the light emitting elements LD may be coupled to each other in a forward direction between the first and second power supplies VDD and VSS, and other light emitting elements LD may be coupled to each other in a reverse direction. In another example, at least one pixel PXL may include only a single light emitting element LD.

In an embodiment, first ends of respective light emitting elements LD may be coupled in common to the corresponding pixel circuit PXC through the first electrode, and may be coupled to the first power supply VDD through the pixel circuit PXC and a first power line PL1. Second ends of respective light emitting elements LD may be coupled in common to the second power supply VSS through the second electrode and a second power line PL2.

The emission unit LSU may emit light with luminance corresponding to a driving current supplied thereto through the corresponding pixel circuit PXC. Thereby, an image (e.g., a predetermined image) may be displayed in the display area DA.

The pixel circuit PXC may be coupled to a scan line Si and a data line Dj of the corresponding pixel PXL. For example, when the pixel PXL is disposed in an i-th row and a j-th column of the display area DA, the pixel circuit PXC of the pixel PXL may be coupled to the i-th scan line Si and the j-th data line Dj of the display area DA. The pixel circuit PXC may include first and second transistors T1 and T2, and a storage capacitor Cst.

The first transistor T1 (or a driving transistor) may be coupled between the first power supply VDD and the first electrode of the emission unit LSU. A gate electrode of the first transistor T1 is coupled to a first node N1. The first transistor T1 may control the driving current that is supplied to the emission unit LSU in response to the voltage of the first node N1.

The second transistor T2 (or switching transistor) may be coupled between the data line Dj and the first node N1. A gate electrode of the second transistor T2 may be coupled to the scan line Si.

The second transistor T2 is turned on when a scan signal having a gate-on voltage (e.g., a low voltage) is supplied from the scan line Si, thus electrically coupling the data line Dj and the first node N1 to each other. During each frame period, a data signal of a corresponding frame is supplied to the data line Dj, and may be transferred to the first node N1 via the second transistor T2. Thereby, a voltage corresponding to the data signal is charged in the storage capacitor Cst.

A first electrode of the storage capacitor Cst may be coupled to the first power supply VDD, and a second electrode thereof may be coupled to the first node N1. The storage capacitor Cst may charge a voltage corresponding to the data signal supplied to the first node N1 during each frame period, and may maintain the charged voltage until a data signal of a subsequent frame is supplied.

Although, in FIG. 10A, all of the transistors, e.g., the first and second transistors T1 and T2, included in the pixel circuit PXC are illustrated as being P-type transistors, the present disclosure is not limited thereto. In other words, at least one of the first and second transistors T1 and T2 may be an N-type transistor.

For example, as shown in FIG. 10B, both the first and second transistors T1 and T2 may be N-type transistors. The pixel PXL illustrated in FIG. 10B may have a configuration and an operation substantially similar to those of the pixel circuit PXC of FIG. 10A, except that the coupling locations of some circuit elements are changed depending on a change in a transistor type. Therefore, a further description of the pixel PXL of FIG. 10B will be omitted.

Meanwhile, the structure of the pixel circuit PXC is not limited to those in the embodiments illustrated in FIGS. 10A and 10B. That is, the pixel circuit PXC may be implemented as any of pixel circuits having various well-known structures and/or driving schemes. In an example, the pixel circuit PXC may be configured as in the embodiment illustrated in FIG. 10C.

Referring to FIG. 10C, the pixel circuit PXC may be further coupled to at least one additional scan line (or control line) in addition to a scan line Si for a corresponding horizontal line. For example, a pixel circuit PXC of a pixel PXL arranged in an i-th row of a display area DA may be further coupled to an (i−1)-th scan line Si−1 and/or an (i+1)-th scan line Si+1. Further, in accordance with an embodiment, the pixel circuit PXC may be further coupled to other power supplies in addition to the first and second power supplies VDD and VSS. For example, the pixel circuit PXC may also be coupled to an initialization power supply Vint. In accordance with an embodiment, the pixel circuit PXC may include first to seventh transistors T1 to T7 and a storage capacitor Cst.

The first transistor T1 may be coupled between the first power supply VDD and a first electrode of the emission unit LSU. A gate electrode of the first transistor T1 may be coupled to a first node N1. The first transistor T1 may control a driving current that is supplied to the emission unit LSU in response to the voltage of the first node N1.

The second transistor T2 may be coupled between a data line Dj and a first electrode of the first transistor T1. A gate electrode of the second transistor T2 may be coupled to a corresponding scan line Si. The second transistor T2 may be turned on when a scan signal having a gate-on voltage is supplied from the scan line Si, thus electrically coupling the data line Dj to the first electrode of the first transistor T1. Therefore, when the second transistor T2 is turned on, a data signal supplied from the data line Dj may be transferred to the first transistor T1.

The third transistor T3 may be coupled between a second electrode of the first transistor T1 and the first node N1. A gate electrode of the third transistor T3 may be coupled to the corresponding scan line Si. The third transistor T3 may be turned on when a scan signal having a gate-on voltage is supplied from the scan line Si, thus coupling the first transistor T1 in the form of a diode.

The fourth transistor T4 may be coupled between the first node N1 and the initialization power supply Vint. A gate electrode of the fourth transistor T4 may be coupled to a previous scan line, for example, the (i−1)-th scan line Si−1. The fourth transistor T4 may be turned on when a scan signal having a gate-on voltage is supplied to the (i−1)-th scan line Si−1, thus transferring the voltage of the initialization power supply Vint to the first node N1. Here, the voltage of the initialization power supply Vint may be less than or equal to a lowest voltage of the data signal.

The fifth transistor T5 may be coupled between the first power supply VDD and the first transistor T1. A gate electrode of the fifth transistor T5 may be coupled to a corresponding emission control line, e.g., an i-th emission control line Ei. The fifth transistor T5 may be turned off in the case in which an emission control signal having a gate-off voltage (e.g., a high voltage) is supplied to the emission control line Ei, and may be turned on in the remaining cases.

The sixth transistor T6 may be coupled between the first transistor T1 and the first electrode of the emission unit LSU. A gate electrode of the sixth transistor T6 may be coupled to the corresponding emission control line, e.g., the i-th emission control line Ei. The sixth transistor T6 may be turned off in the case in which an emission control signal having a gate-off voltage is supplied to the emission control line Ei, and may be turned on in the remaining cases.

The seventh transistor T7 may be coupled between the first electrode of the emission unit LSU (or a second node N2) and the initialization power supply Vint. A gate electrode of the seventh transistor T7 may be coupled to any one of scan lines in a subsequent stage, e.g., an (i+1)-th scan line Si+1. The seventh transistor T7 may be turned on when a scan signal having a gate-on voltage is supplied to the (i+1)-th scan line Si+1, thus supplying the voltage of the initialization power supply Vint to the first electrode of the emission unit LSU.

The storage capacitor Cst may be coupled between the first power supply VDD and the first node N1. The storage capacitor Cst may store a voltage corresponding to the data signal supplied to the first node N1 and the threshold voltage of the first transistor T1 during each frame period.

Although, in FIG. 10C, the transistors, e.g., the first to seventh transistors T1 to T7, included in the pixel circuit PXC are illustrated as being P-type transistors, the present disclosure is not limited thereto. For example, at least one of the first to seventh transistors T1 to T7 may be an N-type transistor. Also, in this case, the voltage level of a control signal (e.g., a scan signal and/or a data signal) for controlling at least one of the first to seventh transistors T1 to T7 may be changed.

Further, the structure of the pixel PXL applicable to the present disclosure is not limited to those in the embodiments illustrated in FIGS. 10A to 10C, and the pixel PXL may have any of various well-known structures. For example, the pixel circuit PXC included in the pixel PXL may be implemented as any of pixel circuits having various well-known structures and/or driving schemes. Further, in other embodiments of the present disclosure, the pixel PXL may be configured in a passive light emitting display device or the like. In this case, the pixel circuit PXC may be omitted, and each of first and second electrodes of the emission unit LSU may be directly coupled to a scan line Si, a data line Dj, a power line and/or a control line.

Figure 11:
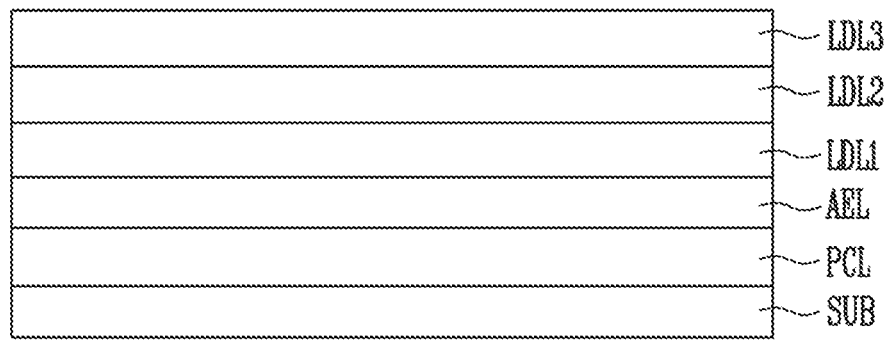
FIG. 11 is a cross-sectional view illustrating an example of the display device of FIG. 9.

FIG. 11 is a cross-sectional view illustrating an example of the display device of FIG. 9.

Referring to FIGS. 9 and 11, the display device (or the display panel PNL) may include a substrate SUB, a pixel circuit layer PCL, a common electrode layer AEL, and a plurality of light emitting element layers LDL1, LDL2, and LDL3. Since the substrate SUB, the common electrode layer AEL, and the light emitting element layers LDL1, LDL2, and LDL3 may be substantially the same as the substrate SUB, the common electrode layer AEL, and the light emitting element layers LDL1, LDL2, and LDL3 described above with reference to FIGS. 4 to 6, repeated descriptions thereof will be omitted.

The pixel circuit layer PCL may be disposed between the substrate SUB and the light emitting element layers LDL1, LDL2, and LDL3 or between the substrate and the common electrode layer AEL. The pixel circuit layer PCL may include the pixel circuit PXC, described above with reference to FIGS. 10A to 10C.

In FIG. 11, although the pixel circuit PCL is illustrated as being disposed between the substrate SUB and the light emitting element layers LDL1, LDL2, and LDL3, the present disclosure is not limited thereto. For example, the pixel circuit layer PCL may be disposed on the substrate SUB and the light emitting element layers LDL1, LDL2, and LDL3, and a transmissive component (or an opening) for transmitting light emitted from the light emitting element layers LDL1, LDL2, and LDL3 in a third direction DR3. That is, the disposition of the pixel circuit layer PCL may be modified in various forms.

Figure 12A:
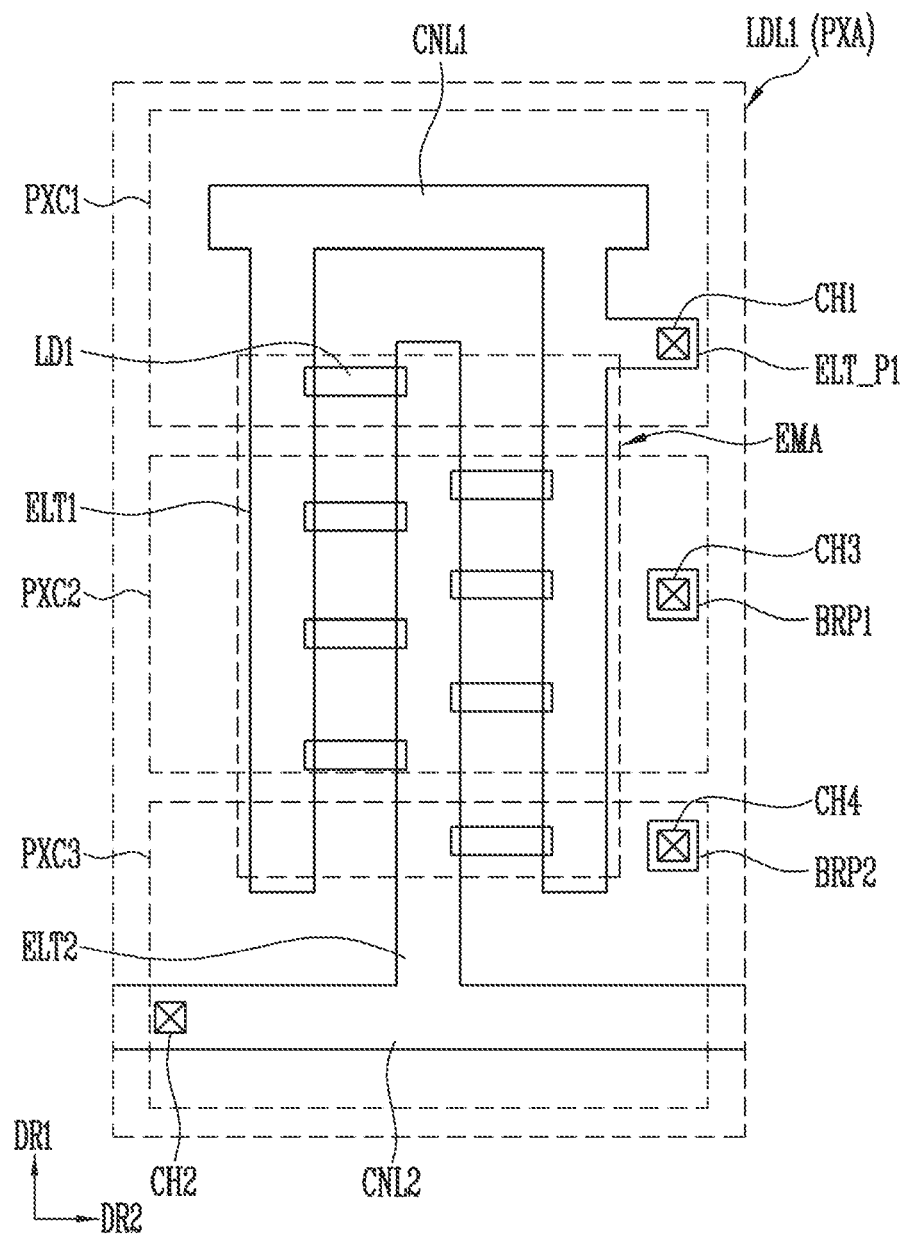
FIGS. 12A to 12C are plan views illustrating an example of a pixel included in the display device of FIG. 9.
Figure 12B:
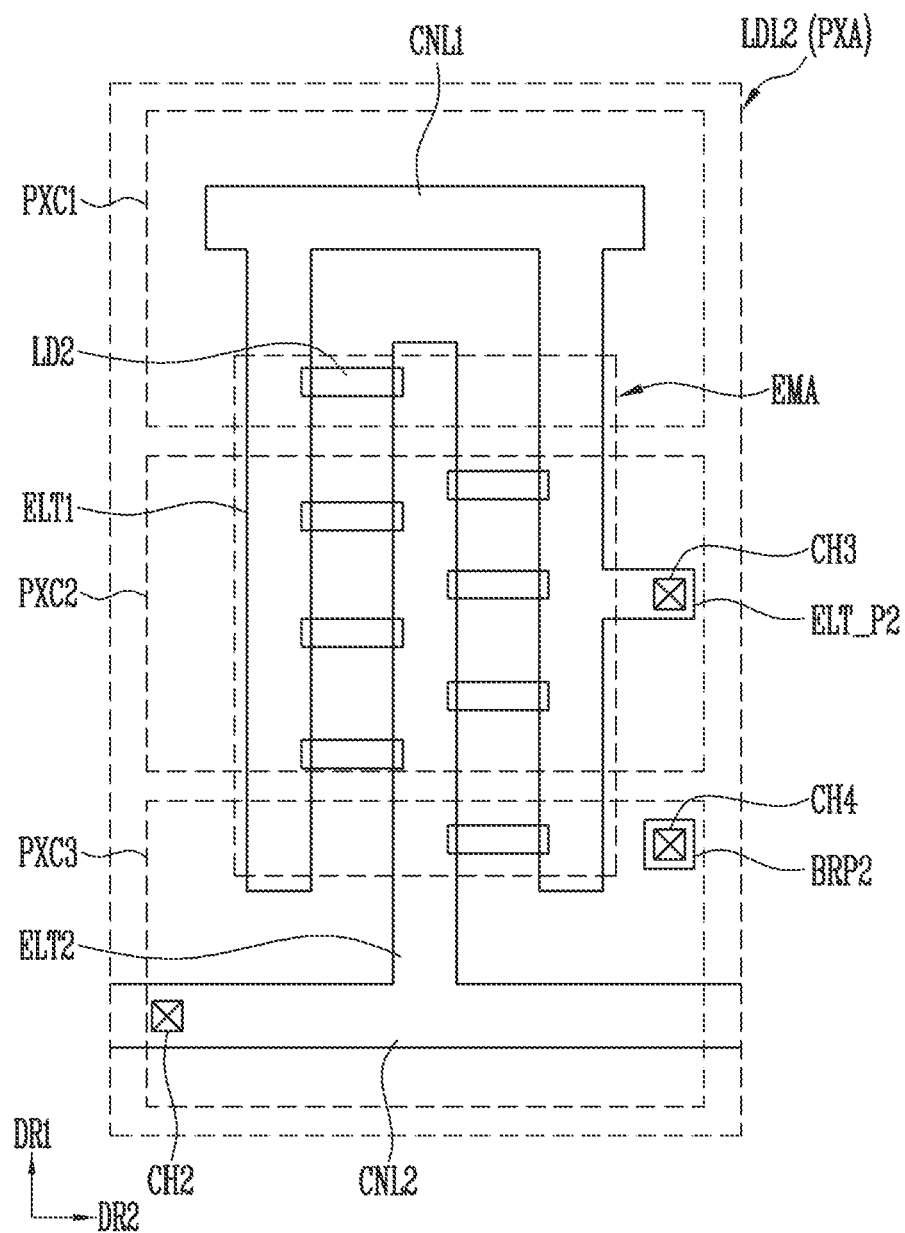
Figure 12C:
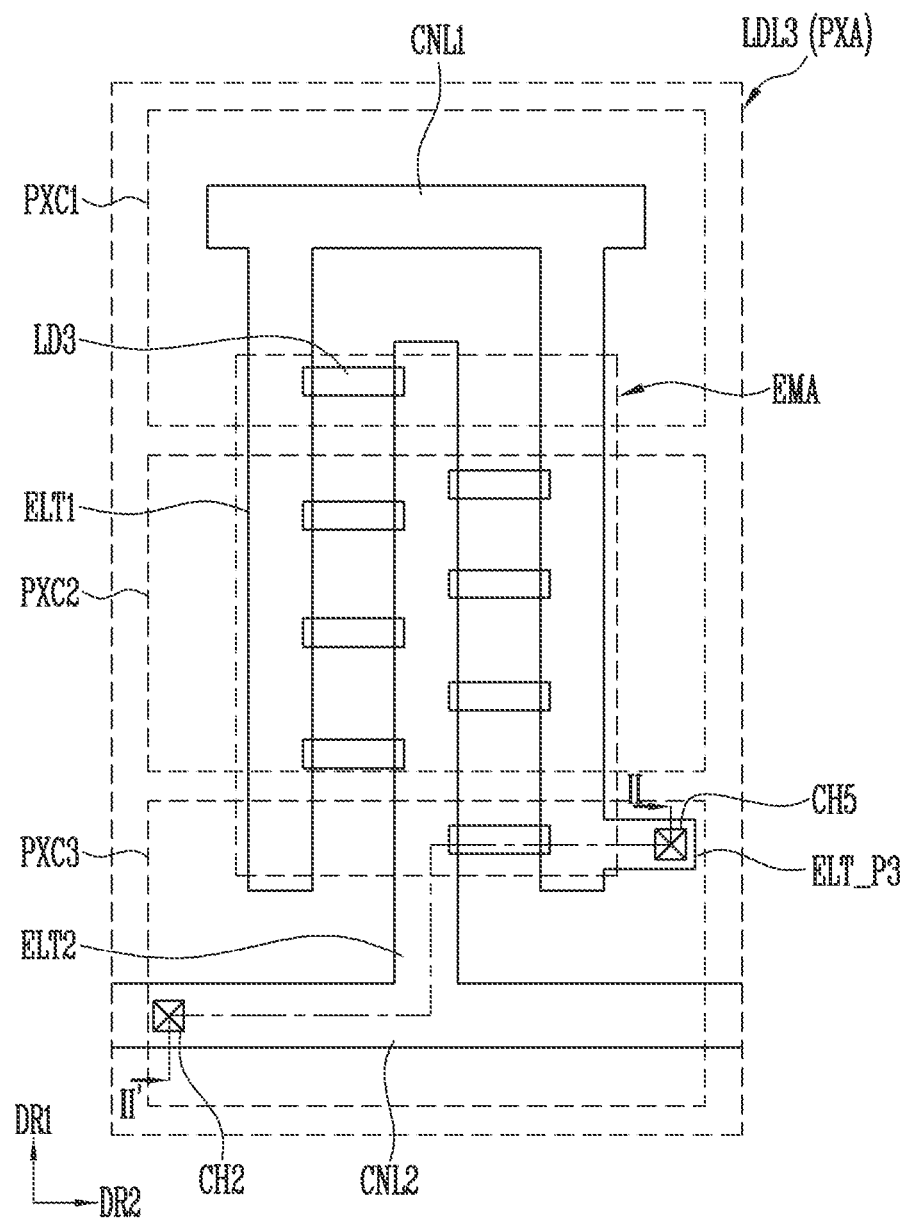

FIGS. 12A to 12C are plan views illustrating an example of a pixel included in the display device of FIG. 9. In FIGS. 12A to 12C, the structure of the pixel PXL is illustrated based on light emitting element layers on which light emitting elements LD of the pixel PXL are arranged. A first light emitting element layer LDL1, described above with reference to FIG. 11, is illustrated in FIG. 12A, a second light emitting element layer LDL2 is illustrated in FIG. 12B, and a third light emitting element layer LDL3 is illustrated in FIG. 12C.

Referring to FIG. 9 and FIGS. 12A to 12C, the pixel PXL may be formed in a pixel area PXA defined on a substrate SUB. The pixel area PXA may include an emission area EMA in which at least one pair of first and second electrodes ELT1 and ELT2 and at least one light emitting element LD coupled between the first and second electrodes ELT1 and ELT2 are arranged. The emission area EMA may be defined by a pixel defining layer (e.g., a bank pattern PW1, PW2, see FIG. 16) that encloses the emission area EMA.

The pixel PXL may include first to third pixel circuits PXC1, PXC2, and PXC3, respectively corresponding to the first to third light emitting element layers LDL1, LDL2, and LDL3. Although the first to third pixel circuits PXC1, PXC2, and PXC3 may be sequentially arranged in the pixel area PXA along a first direction DR1, this arrangement is merely an example, and the arrangement of the pixel circuits PXC1, PXC2, and PXC3 is not limited thereto. In accordance with an embodiment, the first to third pixel circuits PXC1, PXC2 and PXC3 may be formed on a pixel circuit layer PCL (or a circuit element layer including circuit elements such as transistors), described above with reference to FIG. 11.

As illustrated in FIG. 12A, the pixel PXL may include the first electrode ELT1 and the second electrode ELT2 arranged to be spaced apart from each other and first light emitting elements LD1 coupled between the first and second electrodes ELT1 and ELT2, in the pixel area PXA (or the emission area EMA) of the first light emitting element layer LDL1. Since the first and second electrodes ELT1 and ELT2 and the first light emitting elements LD1 may be substantially the same or similar to the first and second electrodes ELT1 and ELT2 and the first light emitting elements LD1, respectively, described above with reference to FIG. 4, repeated descriptions thereof will be omitted.

In an embodiment, the first electrode ELT1 of the first light emitting element layer LDL1 may include a first protrusion ELT_P1. The first protrusion ELT_P1 may be formed to protrude from a portion of the first electrode ELT1 corresponding to the first pixel circuit PXC1 to a non-emission area (i.e., to the outside of the emission area EMA).

The first electrode ELT1 may be coupled to the first pixel circuit PXC, e.g., the pixel circuit PXC illustrated in any of FIGS. 10A to 10C, through the first protrusion ELT_P1 and a first contact hole CH1. In an embodiment, the first contact hole CH1 may be disposed outside the emission area EMA. However, the present disclosure is not limited thereto, and, in an example, the first contact hole CH1 may be disposed inside the emission area EMA.

In accordance with embodiments, the pixel PXL may further include bridge patterns BRP1 and BRP2 disposed in the pixel area PXA of the first light emitting element layer LDL1. For example, the pixel PXL may further include first and second bridge patterns BRP1 and BRP2, wherein the first bridge pattern BRP1 may be disposed to correspond to the second pixel circuit PXC2 in the non-emission area of the pixel PXL, and may be spaced apart from the first and second electrodes ELT1 and ELT2. The first bridge pattern BRP1 may be used to couple the first electrode ELT1 of the second light emitting element layer LDL2 to the second pixel circuit PXC2. Similar to the first bridge pattern BRP1, a second bridge pattern BRP2 may be disposed to correspond to the third pixel circuit PXC3 in the non-emission area of the pixel PXL, and may be spaced apart from the first and second electrodes ELT1 and ELT2. The second bridge pattern BRP2 may be used to couple the first electrode ELT1 of the third light emitting element layer LDL3 to the third pixel circuit PXC3. In an embodiment, at least one of the first and second bridge patterns BRP1 and BRP2 may be omitted.

In an embodiment, the second electrode ELT2 may be coupled to a power supply (e.g., the second power supply VSS, described with reference to FIG. 10A) through the second contact hole CH2 and a power line (not illustrated) coupled thereto. In an embodiment, the second contact hole CH2 may be disposed outside the emission area EMA of the pixel PXL. However, the present disclosure is not limited thereto, and the second contact hole CH2 may be disposed inside the emission area EMA.

As illustrated in FIG. 12B, the pixel PXL may include the first electrode ELT1 and the second electrode ELT2 arranged to be spaced apart from each other and second light emitting elements LD2 coupled between the first and second electrodes ELT1 and ELT2, in the pixel area PXA (or the emission area EMA) of the second light emitting element layer LDL2. Since the first and second electrodes ELT1 and ELT2 and the second light emitting elements LD2 may be substantially the same or similar to the first and second electrodes ELT1 and ELT2 and the second light emitting elements LD2, described above with reference to FIG. 5, repeated descriptions thereof will be omitted.

In an embodiment, the first electrode ELT1 of the second light emitting element layer LDL2 may include a second protrusion ELT_P2. The second protrusion ELT_P2 may be formed to protrude from a portion of the first electrode ELT1, corresponding to the second pixel circuit PXC2, to a non-emission area (i.e., to the outside of the emission area EMA). Also, the second protrusion ELT_P2 may overlap the first bridge pattern BRP1 of the first light emitting element layer LDL1, and may be coupled to the first bridge pattern BRP1 of the first light emitting element layer LDL1 through a third contact hole CH3. That is, the first electrode ELT1 of the second light emitting element layer LDL2 may be coupled to the second pixel circuit PXC2, for example, the pixel circuit PXC illustrated in any of FIGS. 10A to 10C, through the second protrusion ELT_P2, the third contact hole CH3, and the first bridge pattern BRP1 of the first light emitting element layer LDL1.

In accordance with embodiments, the pixel PXL may further include at least one second bridge pattern BRP2 disposed in the pixel area PXA of the second light emitting element layer LDL2. For example, the pixel PXL may further include the second bridge pattern BRP2, wherein the second bridge pattern BRP2 may be disposed to correspond to the third pixel circuit PXC3 in the non-emission area of the pixel PXL, and may be spaced apart from the first and second electrodes ELT1 and ELT2. Further, the second bridge pattern BRP2 of the second light emitting element layer LDL2 may overlap the second bridge pattern BRP2 of the first light emitting element layer LDL1. The second bridge pattern BRP2 may be used to couple the first electrode ELT1 of the third light emitting element layer LDL3 to the third pixel circuit PXC3.

As illustrated in FIG. 12C, the pixel PXL may include the first electrode ELT1 and the second electrode ELT2 arranged to be spaced apart from each other and third light emitting elements LD3 coupled between the first and second electrodes ELT1 and ELT2, in the pixel area PXA (or the emission area EMA) of the third light emitting element layer LDL3. Since the first and second electrodes ELT1 and ELT2 and the third light emitting elements LD3 may be the same or similar to the first and second electrodes ELT1 and ELT2 and the third light emitting elements LD3, described above with reference to FIG. 5, repeated descriptions thereof will be omitted.

In an embodiment, the first electrode ELT1 of the third light emitting element layer LDL3 may include a third protrusion ELT_P3. The third protrusion ELT_P3 may be formed to protrude from a portion of the first electrode ELT1, corresponding to the third pixel circuit PXC3, to a non-emission area (i.e., to the outside of the emission area EMA). Also, the third protrusion ELT_P3 may overlap the second bridge pattern BRP2 of the second light emitting element layer LDL2, and may be coupled to the second bridge pattern BRP2 of the second light emitting element layer LDL2 through a fourth contact hole CH4. That is, the first electrode ELT1 of the third light emitting element layer LDL3 may be coupled to the third pixel circuit PXC3, for example, the pixel circuit PXC illustrated in any of FIGS. 10A to 10C, through the third protrusion ELT_P3, the fourth contact hole CH4, and the second bridge pattern BRP2 of the second light emitting element layer LDL2 (and the second bridge pattern BRP2 of the first light emitting element layer LDL1).

Figure 13:
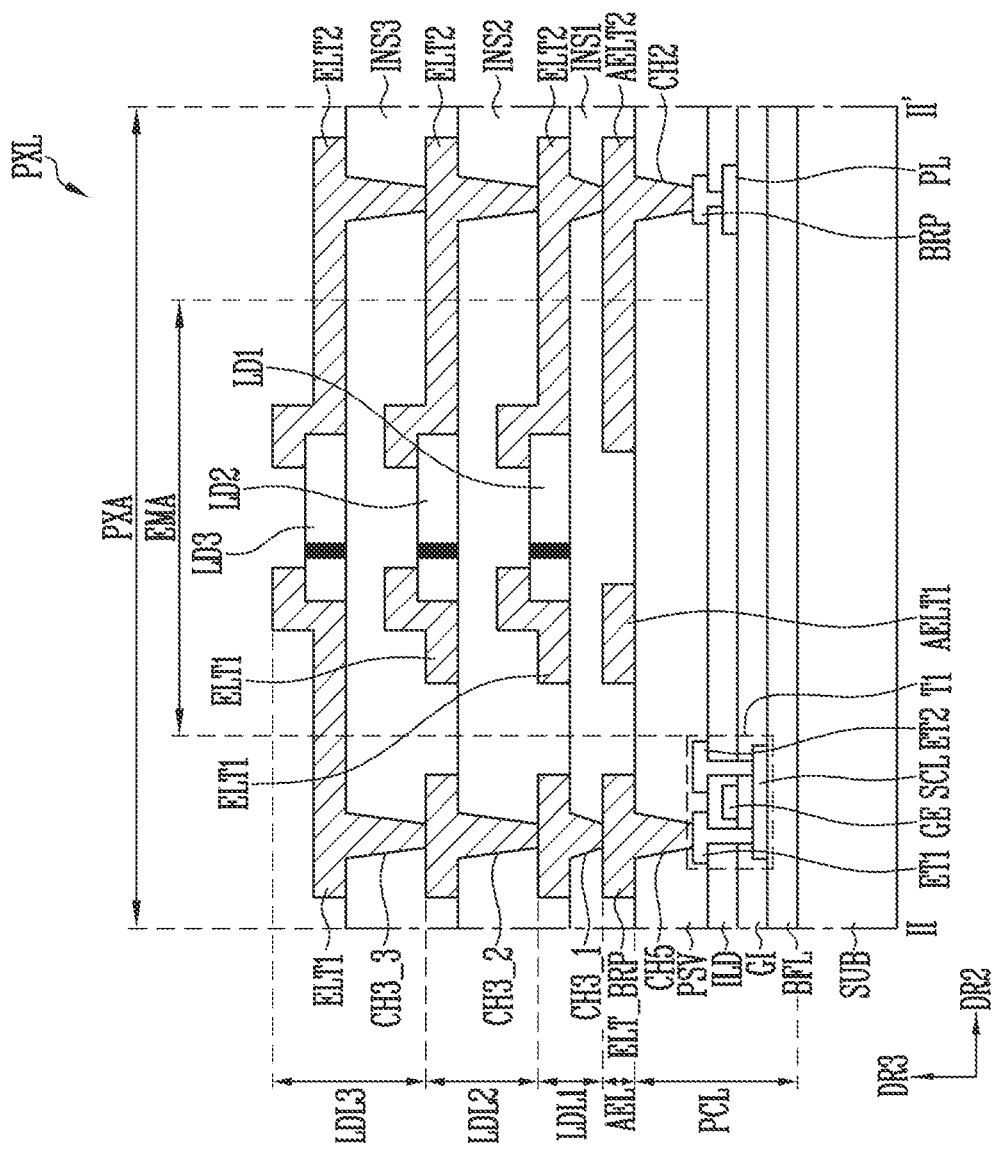
FIG. 13 is a cross-sectional view illustrating an example of the pixel taken along the line II-II' of FIG. 12C.

FIG. 13 is a cross-sectional view illustrating an example of the pixel taken along the line II-II' of FIG. 12C.

Referring to FIGS. 9, 11, 12C, and 13, a pixel circuit layer PCL and light emitting element layers LDL1, LDL2, and LDL3 may be sequentially arranged in the pixel area PXA of the substrate SUB. In an embodiment, a common electrode layer AEL may be further disposed between the pixel circuit layer PCL and the first light emitting element layer LDL1.

In an embodiment, the pixel circuit layer PCL and the light emitting element layers LDL1, LDL2, and LDL3 may be formed on the overall surface of the display area DA of the display panel PNL.

In an embodiment, the pixel circuit layer PCL may include circuit elements forming the pixel circuit PXC of the pixel PXL.

For example, the pixel circuit layer PCL may include a plurality of transistors, e.g., first transistors T1 of FIGS. 10A and 10B, arranged in the pixel area PXA. Although not illustrated in FIG. 13, the pixel circuit layer PCL may include a storage capacitor Cst arranged in the pixel area PXA, various types of signal lines (e.g., a scan line Si and a data line Dj of FIGS. 10A and 10B) coupled to the pixel circuit PXC, and various types of power lines (e.g., a first power supply line PL1 and a second power supply line PL2 for respectively transferring first power VDD and second power VSS, as shown in FIGS. 10A to 10C) coupled to the pixel circuit PXC and/or the light emitting elements LD.

In an embodiment, the pixel circuit layer PCL may have a cross-sectional structure substantially the same or similar to that of the plurality of transistors provided in the pixel circuit PXC, for example, the first transistor T1. However, the present disclosure is not limited thereto, and, in other embodiments, at least some of the plurality of transistors may have different types and/or structures.

Further, the pixel circuit layer PCL may include a plurality of insulating layers. For example, the pixel circuit layer PCL may include a buffer layer BFL, a gate insulating layer GI, an interlayer insulating layer ILD, and a passivation layer PSV which are sequentially stacked on a surface of the substrate SUB.

In an embodiment, the buffer layer BFL may prevent or substantially prevent impurities from being diffused to circuit elements. In an embodiment, the buffer layer BFL may be configured in a single layer structure, but may be configured in a multilayer structure having two or more layers. In the case in which the buffer layer BFL is provided in a multilayer structure, the respective layers may be formed of the same material or different materials. However, in accordance with embodiments, the buffer layer BFL may be omitted.

In an embodiment, the first transistor T1 may include a semiconductor layer SCL, a gate electrode GE, a first transistor electrode ET1, and a second transistor electrode ET2. In accordance with an embodiment, although, in FIG. 13, the first transistor T1 is illustrated as having the first transistor electrode ET1 and the second transistor electrode ET2 formed separately from the semiconductor layer SCL, the present disclosure is not limited thereto. For example, in another embodiment of the present disclosure, first and/or second transistor electrodes ET1 and ET2 provided in at least one transistor arranged in the pixel area PXA may be configured to be integrated with respective semiconductor layers SCL.

The semiconductor layer SCL may be disposed on the buffer layer BFL. For example, the semiconductor layer SCL may be disposed between the substrate SUB on which the buffer layer BFL is formed and the gate insulating layer GI. The semiconductor layer SCL may include a first region coming into contact with the first transistor electrode ET1, a second region coming into contact with the second transistor electrode ET2, and a channel region disposed between the first and second regions. In an embodiment, one of the first and second regions may be a source region and the other thereof may be a drain region.

In an embodiment, the semiconductor layer SCL may be a semiconductor pattern formed of polysilicon, amorphous silicon, an oxide semiconductor, etc. Also, the channel region of the semiconductor layer SCL may be an intrinsic semiconductor as a semiconductor pattern undoped with impurities, and the first and second regions of the semiconductor layer SCL may be semiconductor patterns doped with impurities (e.g., predetermined impurities).

The gate electrode GE may be disposed on the semiconductor layer SCL with the gate insulating layer GI interposed therebetween. For example, the gate electrode GE may be disposed between the gate insulating layer GI and the interlayer insulating layer ILD so as to overlap at least a portion of the semiconductor layer SCL.

The first and second transistor electrodes ET1 and ET2 may be disposed on the semiconductor layer SCL and the gate electrode GE with at least one interlayer insulating layer IDL interposed therebetween. For example, the first and second transistor electrodes ET1 and ET2 may be interposed between the interlayer insulating layer ILD and the passivation layer PSV. The first and second transistor electrodes ET1 and ET2 may be electrically coupled to the semiconductor layer SCL. For example, the first and second transistor electrodes ET1 and ET2 may be respectively coupled to the first region and the second region of the semiconductor layer SCL through contact holes passing through the gate insulating layer GI and the interlayer insulating layer ILD.

In accordance with an embodiment, any of the first and second transistor electrodes ET1 and ET2 of at least one transistor (e.g., the first transistor T1 illustrated in FIGS. 10A and 10B) provided in the pixel circuit PXC may be electrically coupled to a bridge electrode ELT_BRP disposed on the top of the passivation layer PSV through the fifth contact hole CH5 passing through the passivation layer PSV.

In an embodiment, at least one signal line and/or power line coupled to the pixel PXL may be disposed on the same layer as first electrodes of the circuit elements forming the pixel circuit PXC. For example, a power line PL (e.g., a second power line PL2 for supplying the second power VSS) may be disposed on the same layer as the gate electrode GE of the first transistor T1, and may be coupled to the second common electrode AELT2 disposed on the top of the passivation layer PSV, through a bridge pattern BRP that is disposed on the same layer as the first and second transistor electrodes ET1 and ET2 and at least one second contact hole CH2 that passes through the passivation layer PSV. However, the structure and/or the location of the power line PL may be changed in various forms.

The common electrode layer AEL may include the first common electrode AELT1 and the second common electrode AELT2. Since the first and second common electrodes AELT1 and AELT2 may be substantially the same as the first and second common electrodes AELT1 and AELT2, described above with reference to FIG. 6, repeated descriptions thereof will be omitted.

The common electrode layer AEL may further include a bridge electrode ELT_BRP. The bridge electrode ELT_BRP may be disposed to overlap the second bridge pattern BRP2 of the first light emitting element layer LDL1, described above with reference to FIG. 12A. The bridge electrode ELT_BRP may couple the first electrode ELT1 of the third light emitting element layer LDL3 and the first transistor T1 of the pixel circuit layer PCL (or the first transistor electrode ET1) to each other.

The light emitting element layers LDL1, LDL2, and LDL3 may respectively include the first to third light emitting elements LD1, LD2, and LD3 of the pixel PXL. Since the light emitting element layers LDL1, LDL2, and LDL3 may be substantially the same as the light emitting element layers LDL1, LDL2, and LDL3, described above with reference to FIG. 6, repeated descriptions thereof will be omitted.

As described above with reference to FIGS. 12A to 12C, the second electrode ELT2 of the first light emitting element layer LDL1 may be coupled to the second common electrode AELT2 via a through hole passing through the first insulating layer INS1, the second electrode ELT2 of the second light emitting element layer LDL2 may be coupled to the second electrode ELT2 of the first light emitting element layer LDL1 via a through hole passing through the second insulating layer INS2, and the second electrode ELT2 of the third light emitting element layer LDL3 may be coupled to the second electrode ELT2 of the second light emitting element layer LDL2 via a through hole passing through the third insulating layer INS3.

In an embodiment, the first electrode ELT1 of the third light emitting element layer LDL3 may be coupled to the first transistor T1 (or the first transistor electrode ET1) of the pixel circuit layer PCL via at least one through hole passing through the insulating layers INS1, INS2, and INS3 (e.g., first to third sub-through holes CH3_1, CH3_2, and CH3_3 respectively passing through the first to third insulating layers INS1 to INS3) and a bridge electrode ELT_BRP.

As described above with reference to FIGS. 12A to 13, the pixel PXL may include the pixel circuit layer PCL, the common electrode layer AEL, and the first to third light emitting element layers LDL1, LDL2, and LDL3 which are sequentially stacked on the substrate SUB, and the first to third light emitting element layers LDL1, LDL2, and LDL3 may be coupled to the first to third pixel circuits PXC1, PXC2, and PXC3, respectively, formed on the pixel circuit layer PCL.

Because light emitting element layers LDL1, LDL2, and LDL3 corresponding to different colors are arranged in three dimensions in a limited area (i.e., the pixel area PXA), the display device (or the display panel PNL) may have improved luminance.

Further, the light emitting element layers LDL1, LDL2, and LDL3 respectively form sub-pixels which emit light in different colors, such as red, green, and blue, and, thus, the display device (or the display panel PNL) may have high resolution (or high definition).

Although in FIG. 13, the second common electrode AELT2 is illustrated as being coupled to the respective second electrodes ELT2 of the light emitting element layers LDL1, LDL2, and LDL3, the present disclosure is not limited thereto. For example, the second electrode ELT2 of each of the light emitting element layers LDL1, LDL2, and LDL3 may be coupled to the power line PL through a separate bridge electrode without being coupled to the second common electrode AELT2.

Figure 14:
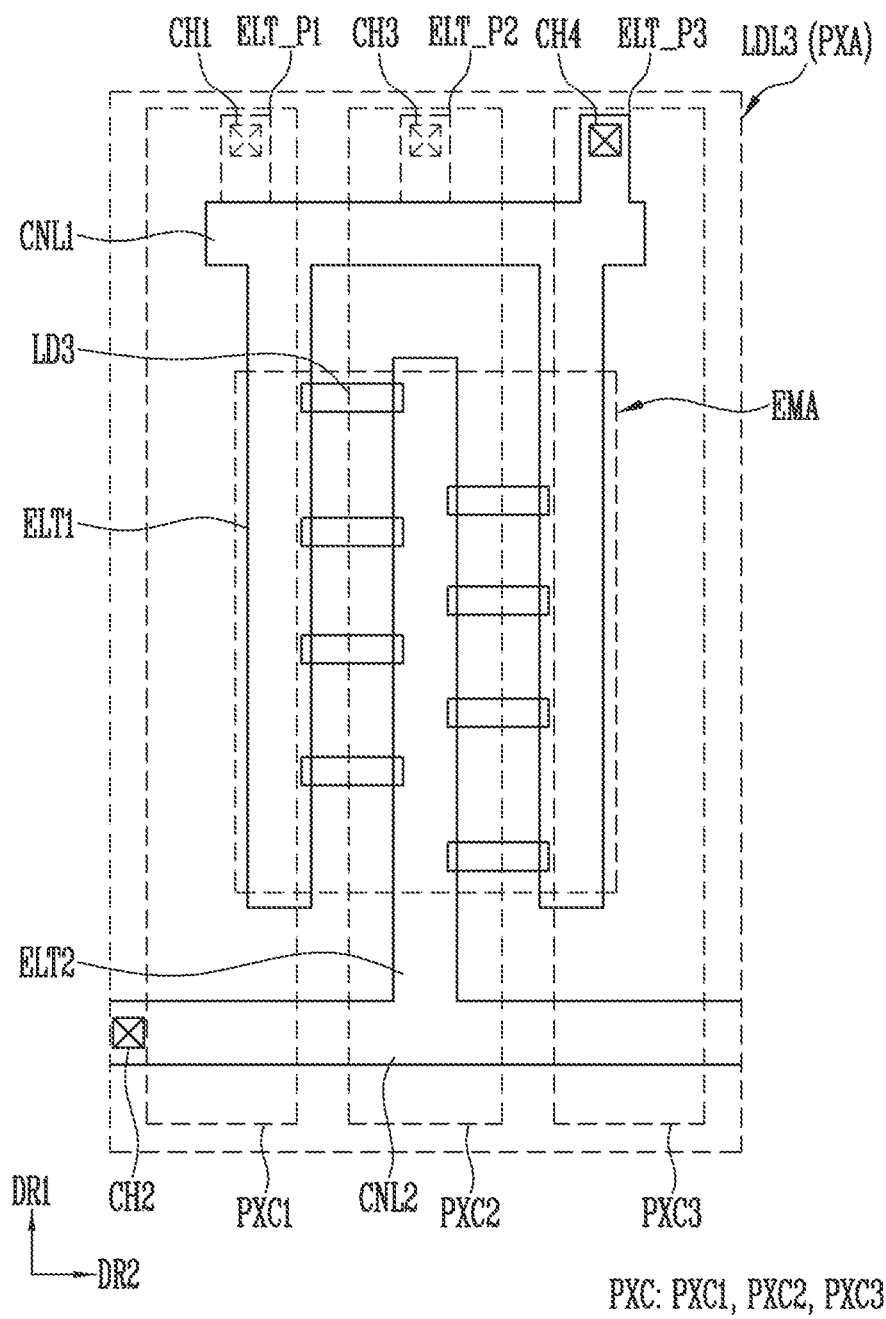
FIG. 14 is a plan view illustrating an example of a pixel included in the display device of FIG. 9.

FIG. 14 is a plan view illustrating an example of a pixel included in the display device of FIG. 9. In FIG. 14, the structure of the pixel PXL is illustrated based on the third light emitting element layer LDL3, described above with reference to FIGS. 11 and 12C.

The pixel PXL of FIG. 14 may be substantially the same or similar to the pixel PXL described above with reference to FIGS. 12A to 12C, except for the arrangement of first to third pixel circuits PXC1, PXC2, and PXC3 and the coupling of the first electrode ELT1 to the pixel circuits. Thus, repeated descriptions thereof will be omitted.

Referring to FIG. 14, the pixel PXL may include first to third pixel circuits PXC1, PXC2, and PXC3, and the first to third pixel circuits PXC1, PXC2, and PXC3 may be sequentially arranged in a second direction DR2.

The first electrode ELT1 (or the first connection electrode CNL1) of each of the light emitting element layers may include a protrusion corresponding to a corresponding pixel circuit (i.e., one of the first to third pixel circuits PXC1, PXC2, and PXC3).

As illustrated in FIG. 14, the first electrode ELT1 of the third light emitting element layer LDL3 may include a third protrusion ELT_P3. The third protrusion ELT_P3 may be formed to protrude from a portion of the first electrode ELT1 corresponding to the third pixel circuit PXC3 to an edge of the pixel area PXA. However, the projection direction of the third protrusion ELT_P3 illustrated in FIG. 14 is merely an example and is not limited thereto.

The third protrusion ELT_P3 may be coupled to the third pixel circuit PXC3 through a fifth contact hole CH5. Since the coupling configuration between the third protrusion ELT_P3 and the third pixel circuit PXC3 may be substantially the same as the coupling configuration between the third protrusion ELT_P3 and the third pixel circuit PXC3, described above with reference to FIGS. 12C and 13, repeated descriptions thereof will be omitted.

Similarly, a first protrusion ELT_P1 is formed to protrude from a portion of the first electrode ELT1 of the first light emitting element layer LDL1 (see FIG. 12A) corresponding to the first pixel circuit PXC1, and may be coupled to the first pixel circuit PXC1 through the first contact hole CH1.

A second protrusion ELT_P2 is formed to protrude from a portion of the first electrode ELT1 of the second light emitting element layer LDL2 (see FIG. 12B) corresponding to the second pixel circuit PXC2, and may be coupled to the second pixel circuit PXC2 through the third contact hole CH3.

As described above with reference to FIG. 14, the pixel circuits PXC1, PXC2, and PXC3 and configurations for coupling the light emitting element layers LDL1, LDL2, and LDL3 to the pixel circuits may be modified in various forms.

Figure 15:
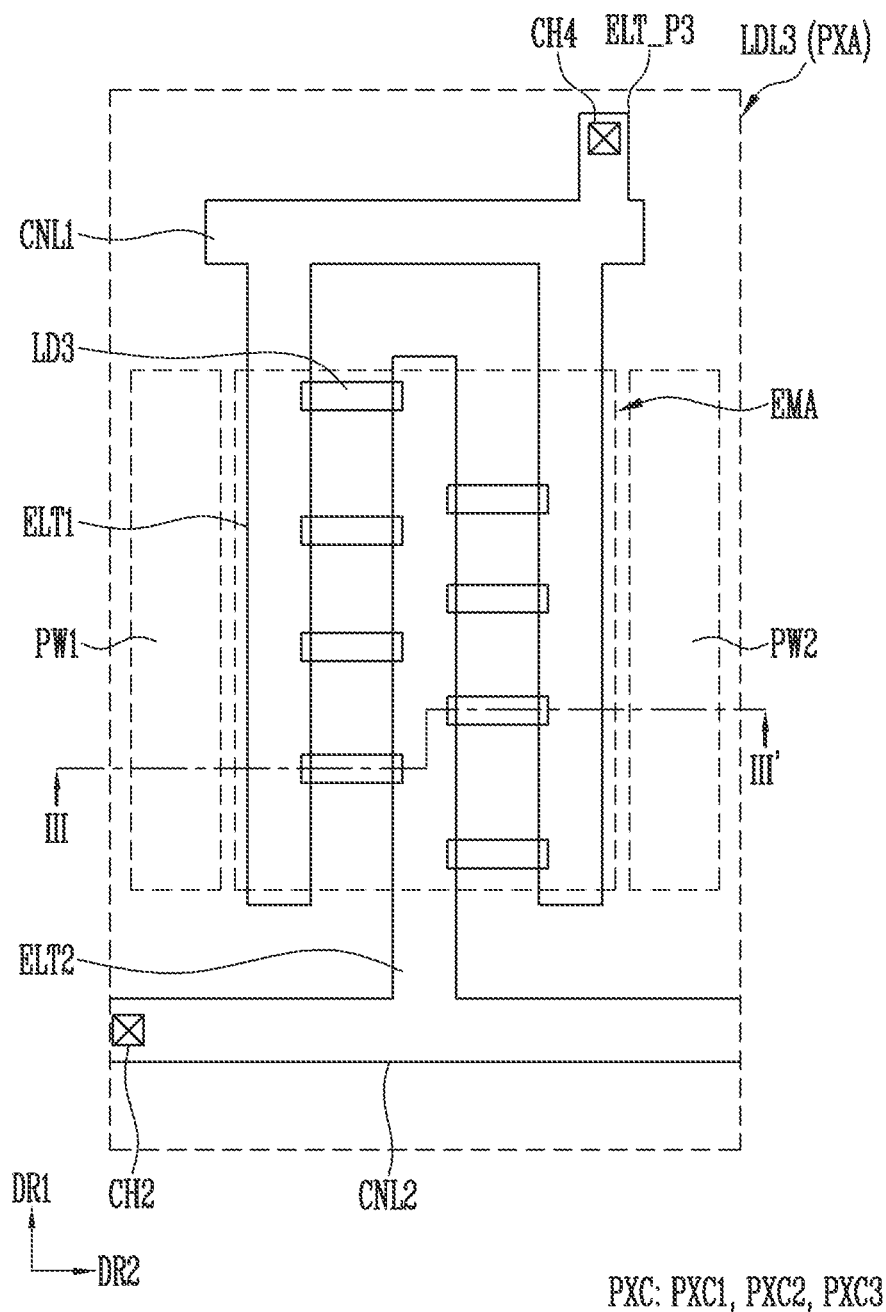
FIG. 15 is a plan view illustrating an example of a pixel included in the display device of FIG. 9.
Figure 16:
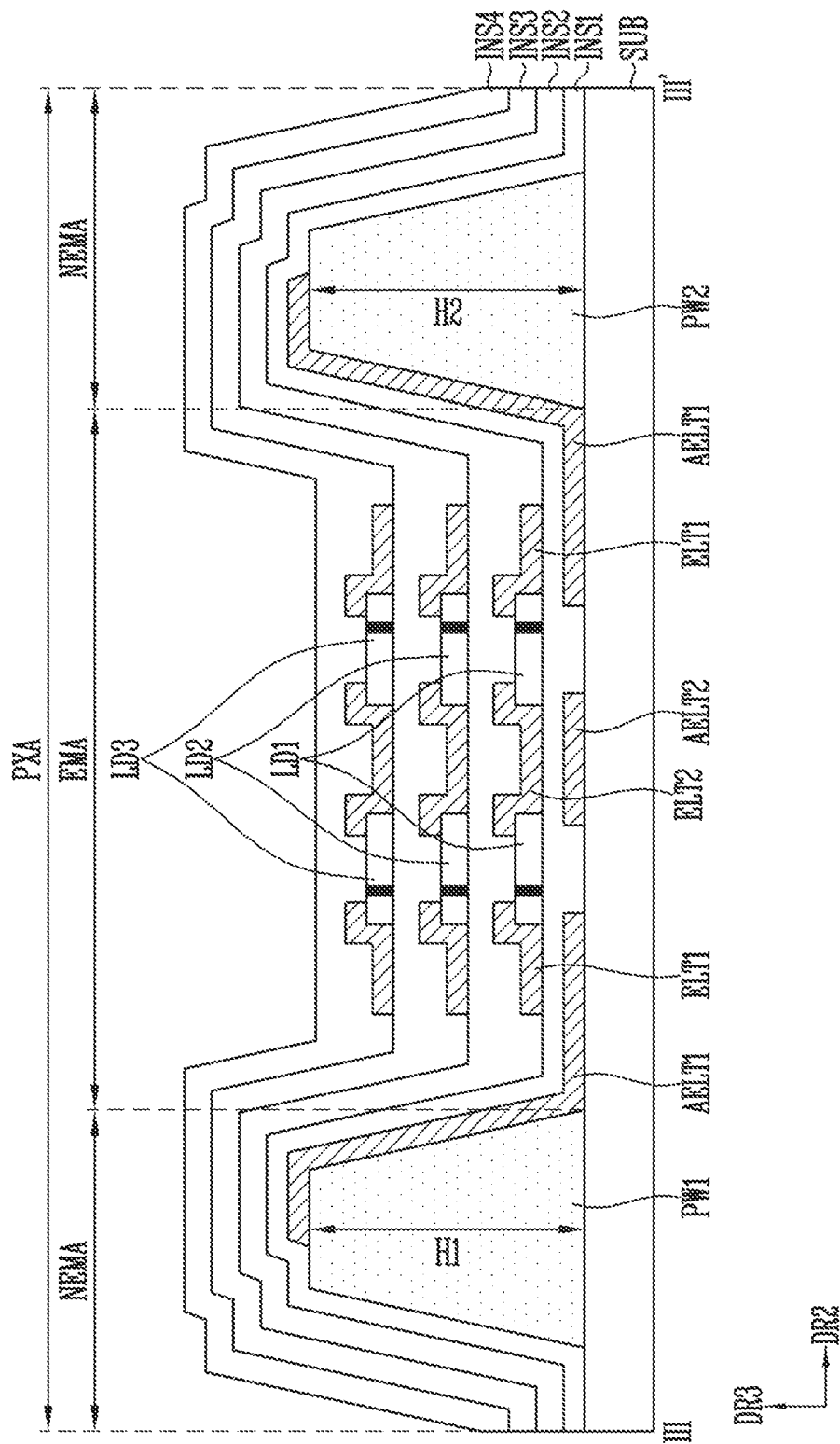
FIG. 16 is a cross-sectional view illustrating an example of the pixel taken along the line III-III' of FIG. 15.

FIG. 15 is a plan view illustrating an example of a pixel included in the display device of FIG. 9. In FIG. 15, the structure of the pixel PXL is illustrated based on a third light emitting element layer LDL3, described above with reference to FIGS. 11 and 12C. FIG. 16 is a cross-sectional view illustrating an example of the pixel taken along the line Ill-III' of FIG. 15. In FIG. 16, a pixel circuit layer PCL is omitted, and the structure of the pixel PXL is schematically illustrated based on light emitting element layers.

Referring to FIGS. 14 to 16, the pixel PXL of FIG. 15 is different from the pixel PXL of FIG. 14 in that the pixel PXL of FIG. 15 further includes a first bank pattern PW1 and a second bank pattern PW2.

In embodiments, the first bank pattern PW1 and the second bank pattern PW2 may be arranged in a non-emission area NEMA, and may be disposed along at least a portion of the edge of the emission area EMA.

As illustrated in FIG. 16, the first and second bank patterns PW1 and PW2 may be disposed on a substrate SUB (or a pixel circuit layer PCL described with reference to FIG. 13). The first and second bank patterns PW1 and PW2 may be disposed in the emission area EMA and spaced apart from each other. The first and second bank patterns PW1 and PW2 may protrude in a height direction from the substrate SUB. In an embodiment, a height H1 of the first bank pattern PW1 may be the same as a height H2 of the second bank pattern PW2, but the present disclosure is not limited thereto. The height of the first and second bank patterns PW1 and PW2 may be greater than the height of the light emitting element layers (i.e., light emitting element layers except for the first and second bank patterns PW1 and PW2), and, in an embodiment, the height of the first and second bank patterns PW1 and PW2 may be equal to or greater than 2 μm or may be equal to or greater than 2.5 μm.

In accordance with an embodiment[ 1], the first bank pattern PW1 and the second bank pattern PW2 may be disposed between the substrate SUB and the first common electrode AELT1.

In accordance with an embodiment, the first and second bank patterns PW1 and PW2 may have any of various shapes. In an example, each of the first and second bank patterns PW1 and PW2 may have a cross-sectional shape of a trapezoid, the width of which decreases closer to the top thereof, as illustrated in FIG. 16. In this case, each of the first and second bank patterns PW1 and PW2 may have a sloped surface on at least one side surface thereof. However, the shapes of the first and second bank patterns PW1 and PW2 are not limited thereto.

The first and second bank patterns PW1 and PW2 may include an insulating material including an inorganic material and/or an organic material. For example, the first and second bank patterns PW1 and PW2 may include at least one inorganic layer which contains any of various well-known inorganic insulating materials, as well as $SiN_x$ or $SiO_x$. In an embodiment, the first and second bank patterns PW1 and PW2 may include at least one organic layer including any of various well-known organic insulating materials and/or a photoresist layer, or may be formed of a single layer or a multilayer insulator including organic/inorganic materials in combination. That is, materials forming the first and second bank patterns PW1 and PW2 may have various forms.

In an embodiment, at the step of providing the light emitting elements LD1, LD2, and LD3 to the emission area EMA, the first and second bank patterns PW1 and PW2 may function as a dam structure for preventing or substantially preventing a solution in which the light emitting elements LD1, LD2, and LD3 are mixed with each other from flowing into the emission area EMA of an adjacent pixel PX, or for controlling an amount (e.g., a predetermined amount) of solution to be supplied to each emission area EMA.

In accordance with an embodiment, the first and second bank patterns PW1 and PW2 may function as reflective members. In an example, the first and second bank patterns PW1 and PW2, along with the first common electrode AELT1 provided on the top thereof, may function as reflective members for improving optical efficiency of the pixel PXL by inducing light emitted from respective light emitting elements LD1, LD2, and LD3 in a desired direction.

The first common electrode AELT1 may be disposed on the tops of the first and second bank patterns PW1 and PW2. The first common electrode AELT1 may extend from the emission area EMA to the non-emission area NEMA and then cover at least portions of one side surface (e.g., one side surface adjacent to the emission area EMA) and the top surface of the first and second bank patterns PW1 and PW2.

Although the first common electrode AELT1 is described as covering at least portions of the first and second bank patterns PW1 and PW2, the present disclosure is not limited thereto. For example, the first and second common electrodes AELT1 and AELT2 may be arranged in the emission area EMA, and separate reflective electrodes distinct from the first and second common electrodes AELT1 and AELT2 may cover at least portions of the first and second bank patterns PW1 and PW2. In this case, the reflective electrodes may be formed through the same process as the first and second common electrodes AELT1 and AELT2.

In an embodiment, the first common electrode AELT1 disposed on the tops of the first and second bank patterns PW1 and PW2 may have shapes corresponding to those of the first and second bank patterns PW1 and PW2. For example, while the first common electrode AELT1 has sloped surfaces or curved surfaces corresponding to the first and second bank patterns PW1 and PW2, they may protrude in a height direction (or a thickness direction) of the light emitting element layer LD1, LDL2, and LDL3.

Each of the first and second common electrodes AELT1 and AELT2 may include at least one conductive material. In an example, each of the first and second common electrodes AELT1 and AELT2 may include, but is not limited to, a material corresponding to any of at least one of a metal, such as Ag, Mg, Al, Pt, Pd, Au, Ni, Nd, Ir, Cr, Ti, or alloy thereof, a conductive oxide, such as ITO, IZO, ZnO, or ITZO, and a conductive polymer, such as PEDOT.

Further, each of the first and second common electrodes AELT1 and AELT2 may be configured in a single layer structure or a multilayer structure. In an example, each of the first and second common electrodes AELT1 and AELT2 may include at least one reflective electrode layer. Also, each of the first and second electrodes ELT1 and ELT2 may selectively further include at least one of at least one transparent electrode layer disposed on and/or under the reflective electrode layer and at least one conductive capping layer configured to cover the top of the reflective electrode layer and/or the transparent electrode layer.

In an embodiment, the reflective electrode layer of each of the first and second common electrodes AELT1 and AELT2 may be made of a conductive material having uniform or substantially uniform reflectivity. In an example, the reflective electrode layer may include, but is not limited to, at least one of metals, such as Ag, Mg, Al, Pt, Pd, Au, Ni, Nd, Ir, Cr, and an alloy thereof. That is, the reflective electrode layer may be made of any of various types of reflective conductive materials. When each of the first and second common electrodes AELT1 and AELT2 includes a reflective electrode layer, light emitted from the opposite ends of each of the light emitting elements LD1, LD2, and LD3 may further travel in a direction in which an image is displayed (e.g., a front direction). In particular, when the first and second common electrodes AELT1 and AELT2 is arranged to face the opposite ends of the light emitting elements LD1, LD2, and LD3 while having a sloped surface or a curved surface corresponding to the shape of the first and second bank patterns PW1 and PW2, light emitted from the opposite ends of each of the light emitting elements LD1, LD2, and LD3 may be further reflected from the first and second common electrodes AELT1 and AELT2, and may further travel in the front direction (e.g., the direction upwards from the substrate SUB) of the display panel PNL. Accordingly, the efficiency of light emitted from the light emitting elements LD1, LD2, and LD3 may be improved.

Further, the transparent electrode layer of each of the first and second common electrodes AELT1 and AELT2 may be made of various types of transparent electrode materials. For example, the transparent electrode layer may include, but is not limited to, ITO, IZO or ITZO. In an embodiment, each of the first and second common electrodes AELT1 and AELT2 may be configured in a triple-layer structure having a stack structure of ITO/Ag/ITO. In this way, when each of the first and second common electrodes AELT1 and AELT2 is configured in a multilayer structure of at least two or more layers, a voltage drop attributable to a signal delay (RC delay) may be minimized or reduced. Accordingly, a desired voltage may be effectively transferred to the light emitting elements LD.

In addition, when each of the first and second common electrodes AELT1 and AELT2 includes a conductive capping layer for covering a reflective electrode layer and/or a transparent electrode layer, the reflective electrode layers of the first and second common electrodes AELT1 and AELT2 may be prevented or substantially prevented from being damaged due to failures occurring in a process or the like for manufacturing pixels PXL. However, the conductive capping layer may be selectively included in the first and second common electrodes AELT1 and AELT2, and may be omitted in accordance with embodiments. Further, the conductive capping layers may be regarded as respective components of the first and second common electrodes AELT1 and AELT2, or as separate components arranged on the first and second common electrodes AELT1 and AELT2.

First to fourth insulating layers INS1, INS2, INS3, and INS4 may be sequentially disposed on the first and second common electrodes AELT1 and AELT2, and the first and second electrodes ELT1 and ELT2 and the first to third light emitting elements LD1, LD2, and LD3 may be disposed between the first to fourth insulating layers INS1, INS2, INS3, and INS4. Since the upper configuration of the first and second common electrodes AELT1 and AELT2 may be substantially the same as the configuration of the light emitting element layers LDL1, LDL2, and LDL3, described above with reference to FIGS. 6 to 13, repeated descriptions thereof will be omitted.

As described above with reference to FIGS. 15 and 16, the pixel PXL may include bank patterns PW1 and PW2 which define an emission area EMA and reflective electrodes which cover inner surfaces of the bank patterns PW1 and PW2 (i.e., side surfaces adjacent to the emission area EMA). Therefore, efficiency of light emitted from the pixel PXL may be improved.

The pixel PXL, described above with reference to FIGS. 15 and 16, may also be applied to the light emitting device EU of FIGS. 4 to 6. That is, the light emitting device EU of FIGS. 4 to 6 may further include bank patterns which define an emission area EMA (or a unit emission area) and reflective electrodes (or common electrodes) which cover the inner surfaces of the bank patterns.

In an embodiment of the present disclosure, respective sub-pixels may form respective light emitting devices. For example, a first sub-pixel corresponding to a red sub-pixel may form a red light emitting device, a second sub-pixel corresponding to a green sub-pixel may form a green light emitting device, and a third sub-pixel corresponding to a blue sub-pixel may form a blue light emitting device. Also, a full-color pixel PXL including the first, second, and third sub-pixels may form a full-color light emitting device. That is, embodiments of the present disclosure are not limited to a display device, and may also be widely applied to other types of devices requiring light sources.

While the spirit and scope of the present disclosure is described with reference to some example embodiments, it should be noted that the above-described embodiments are merely provided for purposes of description and should not be considered limiting. Further, it should be understood by those skilled in the art that various changes, substitutions, and alterations may be made herein without departing from the scope of the disclosure as set forth by the following claims.

The scope of the present disclosure is not limited by the above detailed descriptions of the present specification, and should be defined by the accompanying claims. Further, all changes or modifications of the present disclosure derived from the meanings and scope of the claims, and equivalents thereof should be construed as being included in the scope of the present disclosure.

What is claimed is:

1. A light emitting device, comprising:
    a substrate; and
    a plurality of light emitting element layers stacked on the substrate,
    wherein each of the light emitting element layers comprises:
    an insulating layer disposed on an overall surface of the substrate;
    a first electrode and a second electrode disposed on the insulating layer and spaced apart from each other; and
    a plurality of light emitting elements disposed between the first electrode and the second electrode.

2. The light emitting device according to claim 1, further comprising:
    a common electrode layer disposed between a first light emitting element layer closest to the substrate, among the light emitting element layers, and the substrate, and including a first common electrode and a second common electrode spaced apart from each other.

3. The light emitting device according to claim 2, wherein:
    the first electrode overlaps the first common electrode, and
    the second electrode overlaps the second common electrode.

4. The light emitting device according to claim 1, wherein each of the light emitting elements is a rod-type light emitting diode having a size in a range from a nanoscale to a microscale.

5. The light emitting device according to claim 4, wherein each of the light emitting element layers emits monochromatic light.

6. The light emitting device according to claim 4, wherein at least a part of the light emitting element layers emit different colors of light.

7. The light emitting device according to claim 1, wherein:
    the light emitting elements are disposed between the first and second electrodes and the insulating layer,
    respective first ends of the light emitting elements are coupled to the first electrode, and
    respective second ends of the light emitting elements are coupled to the second electrode.

8. The light emitting device according to claim 1, wherein:
    the light emitting element layers comprise a first light emitting element layer, a second light emitting element layer, and a third light emitting element layer that are sequentially disposed on the substrate,
    the first light emitting element layer includes first light emitting elements configured to emit light in a first color,
    the second light emitting element layer includes second light emitting elements configured to emit light in a second color, and
    the third light emitting element layer includes third light emitting elements configured to emit light in a third color.

9. The light emitting device according to claim 1, further comprising a bank pattern disposed between a first light emitting element layer closest to the substrate, among the plurality of light emitting element layers, and the substrate,
    wherein the substrate includes an emission area and a non-emission area around the emission area,
    wherein the light emitting elements are disposed on the emission area of the substrate,
    wherein a thickness of the bank pattern is greater than a thickness of the light emitting element layers.

10. A display device, comprising:
    a substrate;
    a circuit element layer including a plurality of transistors and a power line;
    a common electrode layer including a first common electrode and a second common electrode disposed on the substrate and spaced apart from each other; and
    a plurality of light emitting element layers sequentially disposed on the common electrode layer,
    wherein each of the light emitting element layers comprises:
    an insulating layer disposed on an overall surface of the substrate;
    a first electrode and a second electrode disposed on the insulating layer and spaced apart from each other; and
    a plurality of light emitting elements disposed between the first electrode and the second electrode,
    wherein the first electrode is coupled to one of the transistors, and the second electrode is coupled to the power line.

11. The display device according to claim 10, wherein:
the light emitting element layers comprise a first light emitting element layer, a second light emitting element layer, and a third light emitting element layer that are sequentially disposed on the substrate,
the first light emitting element layer includes first light emitting elements configured to emit light in a first color,
the second light emitting element layer includes second light emitting elements configured to emit light in a second color, and
the third light emitting element layer includes third light emitting elements configured to emit light in a third color.

12. The display device according to claim 11, wherein:
a first electrode of the first light emitting element layer is coupled to a first transistor, among the transistors, through a first contact hole passing through an insulating layer of the first light emitting element layer, and
a second electrode of the first light emitting element layer is coupled to the power line through a second contact hole passing through the insulating layer of the first light emitting element layer.

13. The display device according to claim 12, wherein:
the first light emitting element layer further includes a first bridge pattern disposed to be spaced apart from the first electrode and the second electrode,
a first electrode of the second light emitting element layer is coupled to a second transistor among the transistors through a third contact hole, configured to expose the first bridge pattern by passing through an insulating layer of the second light emitting element layer, and the first bridge pattern of the first light emitting element layer, and
a second electrode of the second light emitting element layer is coupled to the second electrode of the first light emitting element layer through a fourth contact hole configured to expose the second electrode of the first light emitting element layer by passing through the insulating layer of the second light emitting element layer.

14. The display device according to claim 13, wherein:
a first electrode of the third light emitting element layer is coupled to a third transistor, among the transistors, through a fifth contact hole passing through an insulating layer of the third light emitting element layer, and
a second electrode of the third light emitting element layer is coupled to the second electrode of the second light emitting element layer through a sixth contact hole configured to expose the second electrode of the second light emitting element layer by passing through the insulating layer of the third light emitting element layer.

15. A method of manufacturing a display device, the method comprising:
preparing a substrate;
forming, on the substrate, a common electrode layer including a first common electrode and a second common electrode spaced apart from each other;
forming a first light emitting element layer on the common electrode layer; and
forming a second light emitting element layer on the first light emitting element layer,
wherein forming the first light emitting element layer comprises:
forming a first insulating layer on the common electrode layer;
aligning a plurality of first light emitting elements on the first insulating layer, wherein the first light emitting elements are disposed between the first common electrode and the second common electrode on a plan view; and
respectively forming a first electrode on first ends of the first light emitting elements and a second electrode on second ends of the first light emitting elements.

16. The method according to claim 15, wherein each of the first light emitting elements is a rod-type light emitting diode having a size in a range from a nanoscale to a microscale.

17. The method according to claim 15, wherein aligning the first light emitting elements comprises:
providing the first light emitting elements on the first insulating layer; and
applying a first alternating current voltage between the first common electrode and the second common electrode.

18. The method according to claim 17, wherein:
the first electrode overlaps at least a portion of the first common electrode, and
the second electrode overlaps at least a portion of the second common electrode.

19. The method according to claim 17, wherein forming the second light emitting element layer comprises:
forming a second insulating layer on the first light emitting element layer;
aligning a plurality of second light emitting elements between the first common electrode and the second common electrode on a plan view; and
respectively forming a third electrode on first ends of the second light emitting elements and a fourth electrode on second ends of the second light emitting elements.

20. The method according to claim 19, wherein:
the first light emitting elements emit light in a first color, and
the second light emitting elements emit light in a second color.

* * * * *